United States Patent
Tran et al.

(10) Patent No.: US 9,648,716 B2
(45) Date of Patent: May 9, 2017

(54) DIRECT THREE PHASE PARALLEL RESONANT INVERTER FOR REACTIVE GAS GENERATOR APPLICATIONS

(71) Applicant: MKS INSTRUMENTS, INC., Andover, MA (US)

(72) Inventors: Ken Tran, North Chelmsford, MA (US); Feng Tian, Salem, NH (US)

(73) Assignee: MKS Instruments, Inc., Andover, MA (US)

( * ) Notice: Subject to any disclaimer, the term of this patent is extended or adjusted under 35 U.S.C. 154(b) by 0 days.

(21) Appl. No.: 14/843,412

(22) Filed: Sep. 2, 2015

(65) Prior Publication Data
US 2017/0064802 A1   Mar. 2, 2017

(51) Int. Cl.
H02M 5/00   (2006.01)
H05H 1/24   (2006.01)
H02M 7/537  (2006.01)

(52) U.S. Cl.
CPC .............. *H05H 1/24* (2013.01); *H02M 7/537* (2013.01)

(58) Field of Classification Search
CPC .... H02M 7/068; H02M 5/271; H02M 5/4585; H02M 1/32; H02M 3/33592; H02J 3/36; H02J 3/34; Y02B 70/126; H03B 19/00; H03B 19/03
USPC ... 363/3, 10, 34–35, 44, 125, 127, 157, 159, 363/164, 165, 170, 173
See application file for complete search history.

(56) References Cited

U.S. PATENT DOCUMENTS

| | | | |
|---|---|---|---|
| 3,560,835 A | 2/1971 | Rettig | |
| 6,038,152 A * | 3/2000 | Baker | H02M 7/219 363/126 |
| 7,289,341 B2 | 10/2007 | Hesterman | |
| 8,385,096 B2 * | 2/2013 | Yuzurihara | H02M 7/219 307/102 |
| 8,400,129 B2 | 3/2013 | Ouyang | |
| 2003/0095424 A1 * | 5/2003 | Oates | H02J 3/00 363/132 |
| 2007/0217243 A1 | 9/2007 | Yamamoto et al. | |
| 2009/0040800 A1 * | 2/2009 | Sonnaillon | H02M 7/219 363/89 |
| 2013/0257311 A1 | 10/2013 | Tran et al. | |
| 2016/0352238 A1 | 12/2016 | Ogasawara et al. | |

FOREIGN PATENT DOCUMENTS

| | | |
|---|---|---|
| CA | 1051975 A | 4/1979 |
| EP | 0603683 A2 | 6/1994 |
| WO | 2015118990 A1 | 8/2015 |

OTHER PUBLICATIONS

"International Search Report and Written Opinion for PCT Application No. PCT/US2016/049017", Mailed Date: Dec. 5, 2016, Filed Date: Aug. 26, 2016.

\* cited by examiner

*Primary Examiner* — Nguyen Tran
(74) *Attorney, Agent, or Firm* — Talem IP Law, LLP

(57) ABSTRACT

A power system for a reactive gas generator can include a direct three phase inverter. A resonant tank can further be included to receive a square wave output of the direct three phase inverter and provide a sine wave output. The power system can include an inverter controller that turns on and off selected switches of the direct three phase inverter based on states of the three phases of a three phase AC power supply, where a switch is turned on with an adaptive ON time and a modulated OFF time depending on a desired output power.

18 Claims, 23 Drawing Sheets

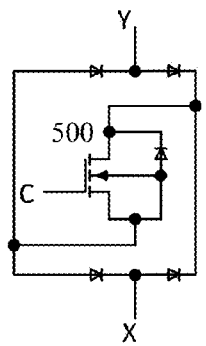
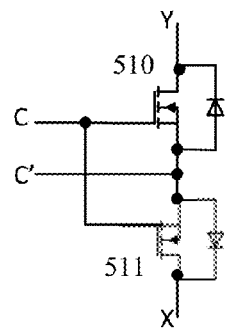
FIG. 5A  FIG. 5B
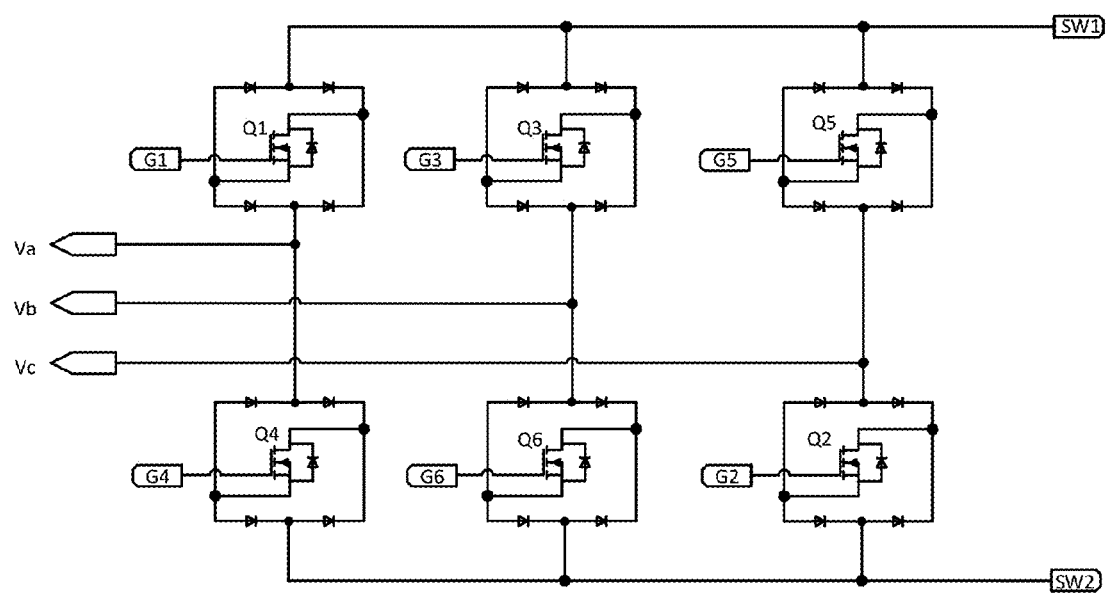
FIG. 6

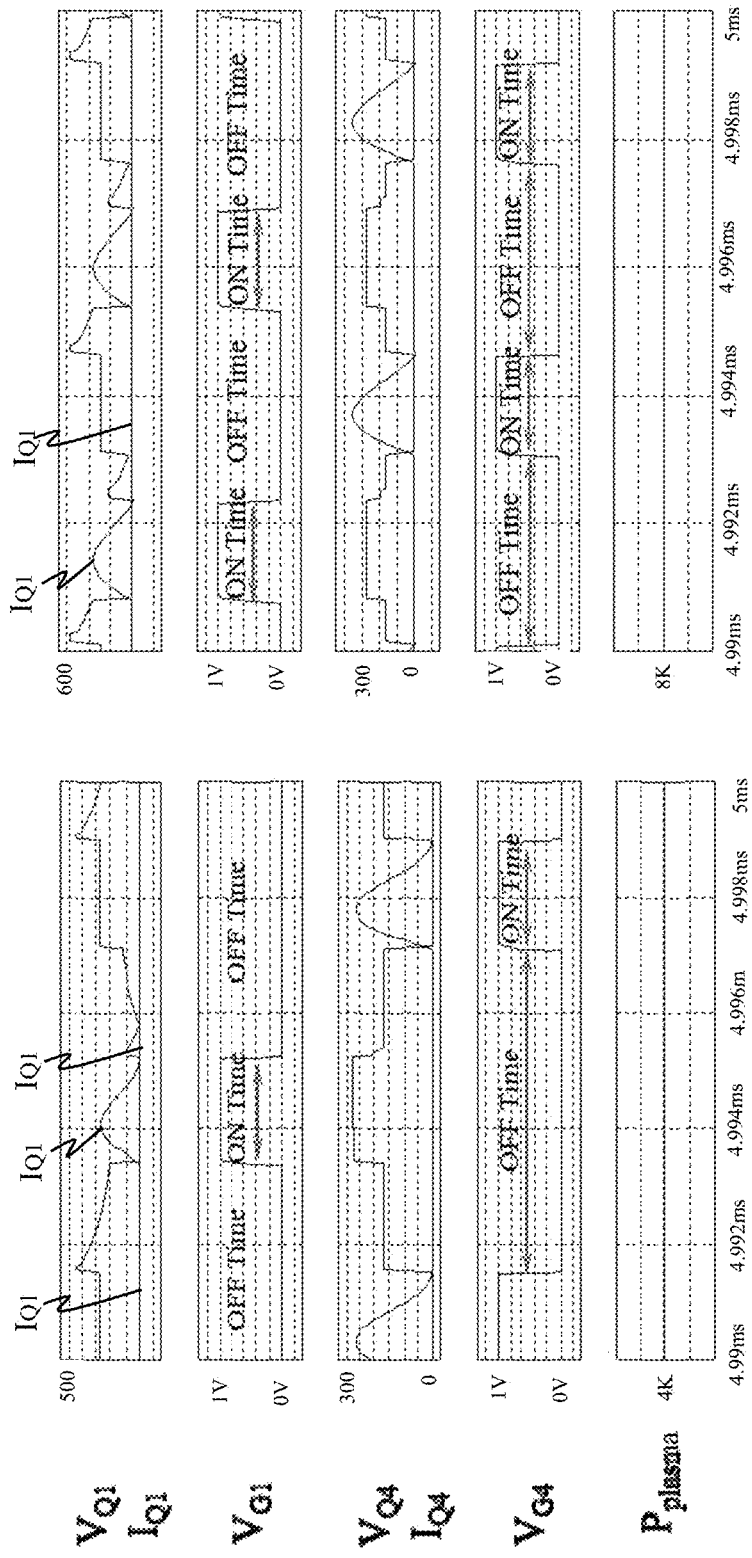
FIG. 10A Low Plasma Power
FIG. 10B High Plasma Power

1405

DIRECT THREE PHASE PARALLEL RESONANT INVERTER FOR REACTIVE GAS GENERATOR APPLICATIONS

BACKGROUND

Power supplies, particularly in the field of plasma applications, require high frequency (e.g., 400 kHz to 4 MHz), high voltage (e.g., 1 kVpk to 10 kVpk), and high power (e.g., 5 kW to 50 kW) capabilities.

In addition, power supplies for plasma applications, such as reactive gas generators, must be able to react to the plasma's impedance changing characteristics so that the power remains stable during system operation, perform efficiently, and be able to fit within the ever decreasing physical area made available to the power supply. A power system for plasma applications may involve converting the standard three phase 208 VAC/480 VAC, 50/60 Hz supply to a high frequency, varying (high) AC output voltage power supply.

BRIEF SUMMARY

Power systems suitable for high frequency applications are presented. The described power systems involve direct three phase parallel resonant inverter schemes.

In some implementations, a power system includes a direct three phase inverter and a resonant tank. The direct three phase inverter can have a first phase input line, a second phase input line, and a third phase input line for receiving a three phase AC input. The resonant tank can be coupled to the direct three phase inverter to receive an output of the direct three phase inverter.

In some implementations, a power system includes a direct three phase inverter and an inverter controller. The direct three phase inverter can have a first phase input line, a second phase input line, and a third phase input line for receiving a three phase AC input. The inverter controller can also be connected to the first phase input line, the second phase input line, and the third phase input line for receiving the three phase AC input. The inverter controller controls the direct three phase inverter based on states of the three phases of the three phase AC input.

In some implementations, a power system includes a direct three phase inverter, a resonant tank, and an inverter controller. The direct three phase inverter can have a first phase input line, a second phase input line, and a third phase input line for receiving a three phase AC input. The resonant tank can be coupled to the direct three phase inverter to receive an output of the direct three phase inverter to generate a sine-wave output. The inverter controller can also be connected to the first phase input line, the second phase input line, and the third phase input line for receiving the three phase AC input. In addition, the inverter controller can be coupled to the resonant tank to receive a sensed output power and sensed output current. The inverter controller can supply control signals to the direct three phase inverter based on states of the three phases of the three phase AC input and the sensed output power and sensed output current.

A method of supplying power to a reactive gas generator can include providing a direct three phase inverter. The method can further include providing one or both of a resonant tank for converting the square wave output of the direct three phase inverter to a sine wave and an inverter controller for controlling the switches of the direct three phase inverter.

The method can further include operating the direct three phase inverter by turning on and off selected switches based on states of the three phases of a three phase AC power supply, where a switch is turned on with an adaptive ON time and a modulated OFF time depending on desired output power.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF THE DRAWINGS

FIGS. 5A and 5B illustrate examples of uni-directional switch configurations.

FIG. 6 is an example inverter power stage.

FIGS. 10A and 10B illustrate adaptive ON time control.

DETAILED DISCLOSURE

Power systems suitable for high frequency applications are presented. High frequency, high voltage, and high power applications can be supported by a power system with a direct three phase inverter. A robust and stable range of operation is further supported by the inclusion of a one-shot gate driving circuit and adaptive ON time control. The adaptive ON time control, using the one-shot gate driving circuit, provides a fairly constant output frequency and adaptive ON time based on the components and load variation. This is how the direct three phase inverter achieves zero current switching for both turn ON and turn OFF.

As used herein, "adaptive ON time" refers to an ON time that increases or decreases in length of time, when the frequency for the signal changes, so that the resulting ON time can be considered constant as the OFF time changes. In an example implementation, a frequency command signal can be used to modulate an OFF time while slightly increasing the ON time at light loads and modulate the OFF time while decreasing the ON time at heavier loads so that the ON time appears to remain constant as the OFF time changes.

Figure 1:
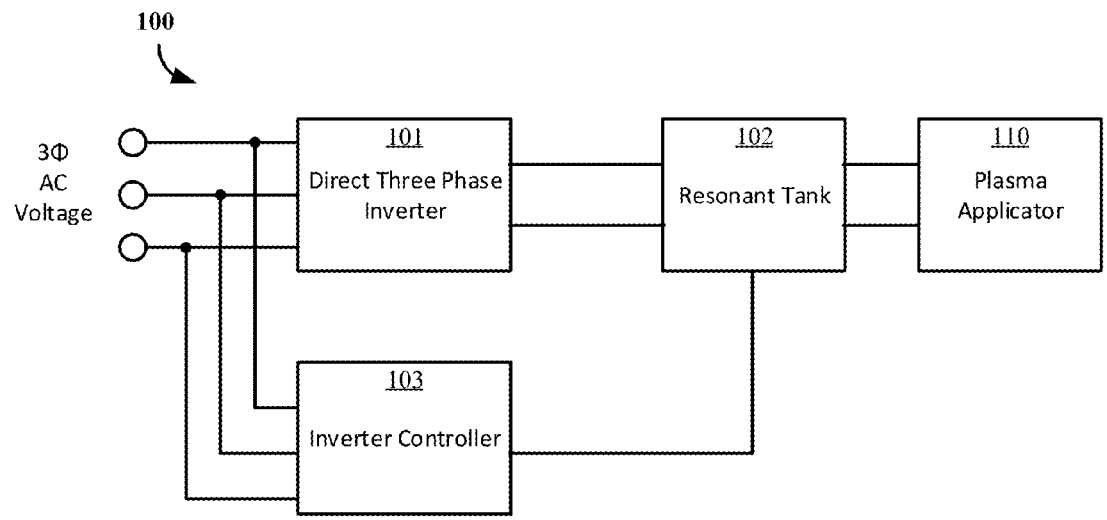
FIG. 1 is a simplified block diagram of a reactive gas generator system implementing an example power system.

FIG. 1 is a block diagram of a reactive gas generator system implementing an example power system. The reactive gas generator system 100 includes a plasma applicator 110 that operates using a high frequency, high voltage signal applied to electrode and applicator transformer winding of the plasma applicator 110. This signal can be generated from a standard three phase supply (e.g., 208 VAC/480, 50/60 Hz supply) by a direct three phase parallel resonant inverter scheme using a direct three phase inverter 101, a resonant tank 102, and an inverter controller 103.

The inverter 101 can be connected to each of the three phases of the three phase power supply via the three signal lines of the delta or wyes configuration of the supply. The inverter controller 103 turns on and off the switches of the inverter 101 while the three phase supply is input to the inverter 101 to transform the 50 Hz or 60 Hz signal to, for example, 400 kHz to 4 MHz. The output of the inverter 101 drives the resonant tank, which converts the high frequency square wave from the inverter 101 to a sine wave signal for the plasma applicator 110. The inverter controller 103 can receive feedback from the resonant tank 102 to adjust the control signal(s) for the inverter 101.

Figure 2A:
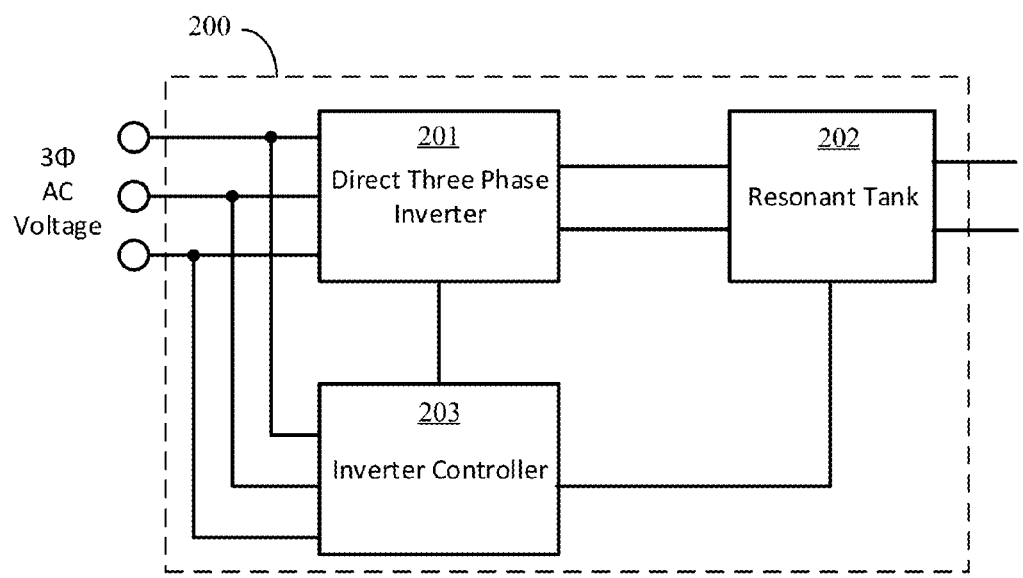
FIGS. 2A-2C illustrate a variety of configurations for a power system.
Figure 2B:
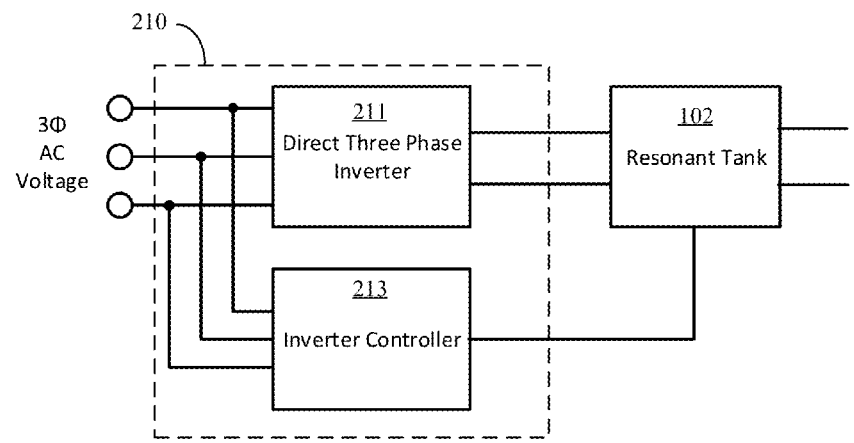
Figure 2C:
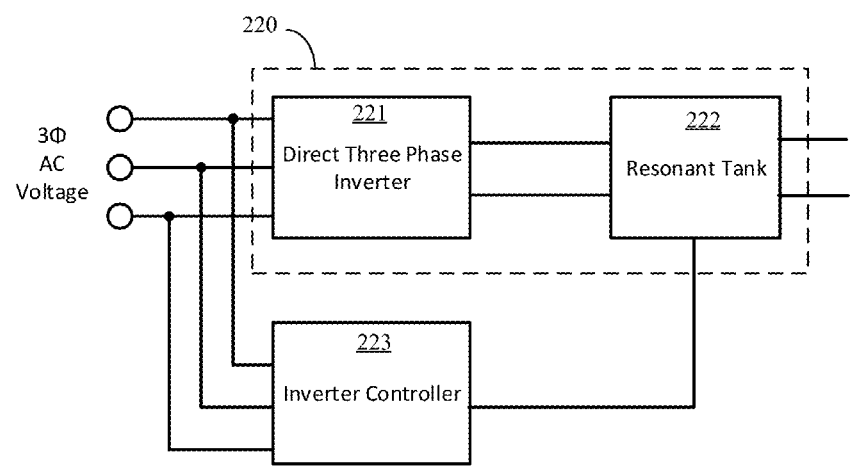

FIGS. 2A-2C illustrate a variety of configurations for a power system. Referring to FIG. 2A, a power system 200 according to an embodiment includes a direct three phase inverter 201, a resonant tank 202, and an inverter controller 203 co-located in a power system packaging. The configuration illustrated in FIG. 2A can be suitable for use with plasma generators, for example as part of the reactive gas generator system 100. The power system packaging containing the power system 200 can be sized to appropriately fit within an available area in a plasma generator apparatus or a manufacturing center in which the plasma generator is deployed. In some cases, as illustrated in FIG. 2B, a power system 210 can include a direct three phase inverter 211 and an inverter controller 213. This component (the power system 210) can be used in a variety of applications—with or without a resonant tank. When used for plasma generation applications, a resonant tank 102 can be provided along with the power system 210 to form a power system suitable for use with plasma generators. FIG. 2C illustrates yet another configuration of a power system. In FIG. 2C, a power system 220 can include a direct three phase inverter 221 and a resonant tank 222. A separate inverter controller 223 can be provided to appropriately turn on and off the switches of the direct three phase inverter 221.

Figure 3A:
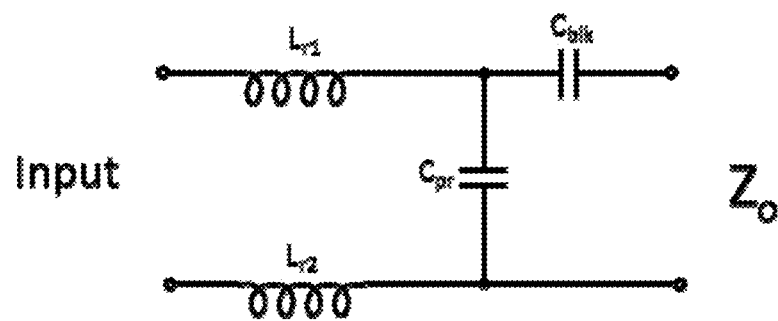
FIGS. 3A-3C illustrate suitable resonant tanks that may form a part of various power systems as described herein.
Figure 3B:
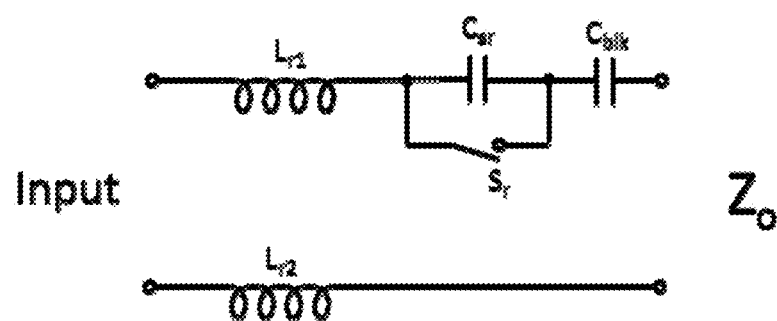
Figure 3C:
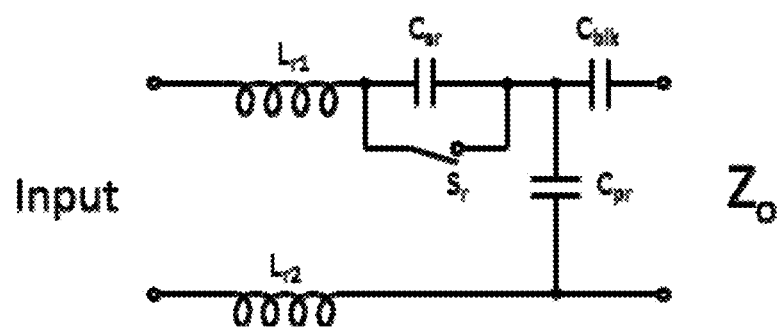

FIGS. 3A-3C illustrate suitable resonant tanks that may form a part of various power systems as described herein. For example, the resonant tank may be a parallel resonant tank such as shown in FIG. 3A, a series resonant tank such as shown in FIG. 3B, a series-parallel resonant tank such as shown in FIG. 3C, or a combination thereof.

Figure 4A:
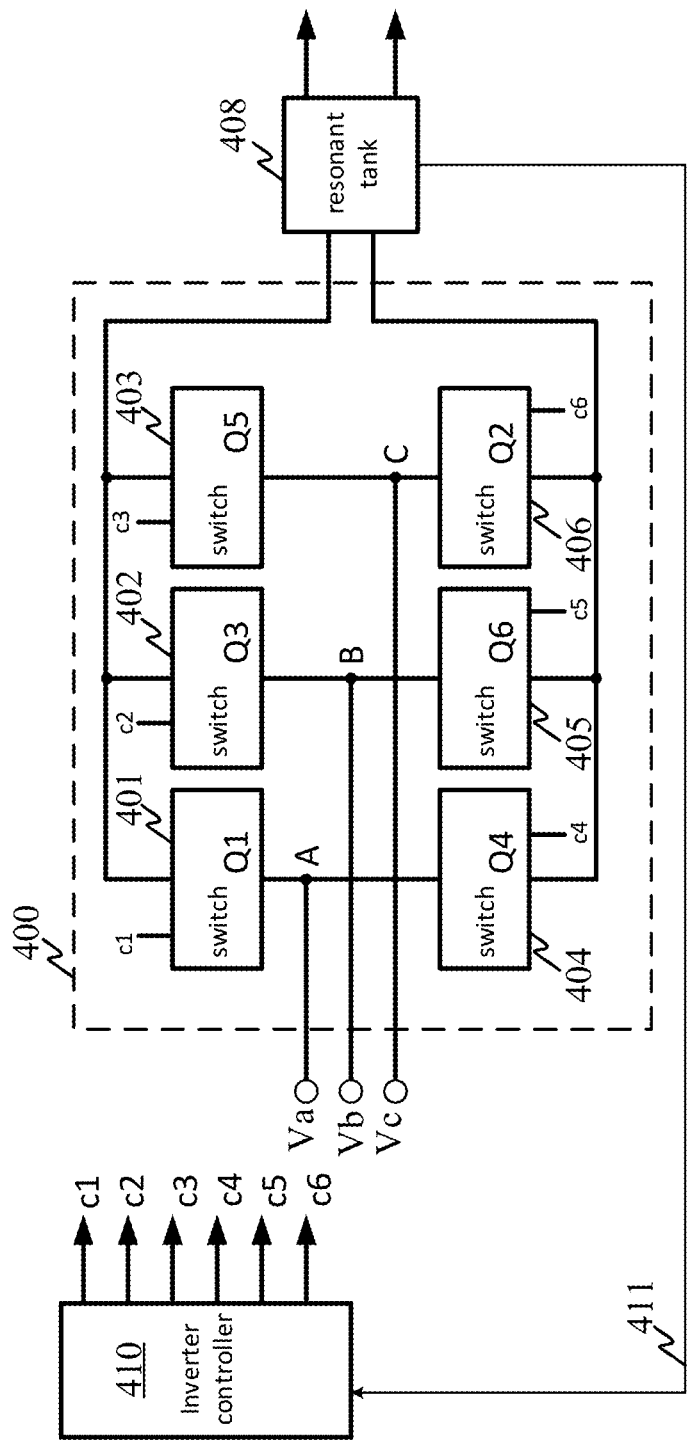
FIG. 4A illustrates an example implementation of a direct three phase parallel resonant inverter power system.
Figure 4C:
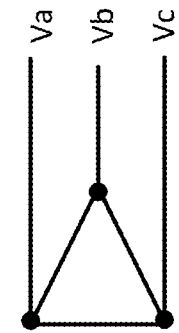
FIGS. 4B and 4C illustrate example three phase AC source configurations that may be used with a direct three phase parallel resonant inverter power system.
Figure 4B:
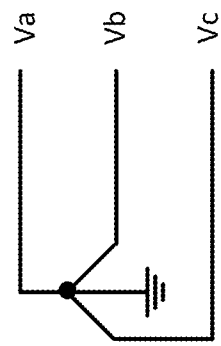

FIG. 4A illustrates an example implementation of a direct three phase parallel resonant inverter power system. The system illustrated in FIG. 4A can be used to implement the direct three phase inverter 101, resonant tank 102, and inverter controller 103 of FIG. 1 in any of the configurations shown in FIGS. 2A-2C. FIGS. 4B and 4C illustrate example three phase ac supply configurations that may be used with a direct three phase parallel resonant inverter power system.

Referring to FIG. 4A, a direct three phase inverter 400 can include six switches 401, 402, 403, 404, 405, and 406. The six switches are uni-directional so that only one direction of current path is available when a switch is turned on. The switches 401, 402, 403, 404, 405, and 406 can include, but are not limited to, transistors such as bipolar junction transistors (BJTs); insulated gate bipolar transistors (IGBTs); and field effect transistors (FETs), including MOSFETs (metal oxide semiconductor field effect transistors) and high electron mobility transistors (HEMTs). In many cases a power device including, but not limited to, a power transistor of any of the above described transistors (e.g., of sizes and/or materials having appropriate breakdown voltages) is selected for as part of the switch.

FIGS. 5A and 5B illustrate examples of uni-directional switch configurations. As illustrated in FIG. 5A, a switch for a direct three phase inverter can include a power device such as power transistor 500 and four diodes directing the current in a particular direction depending on the voltage across the various nodes. A control signal C is applied to turn on or off the transistor and the signal nodes X and Y couple the switch between a phase input and a resonant tank. In another example as illustrated in FIG. 5B, a switch for a direct three phase inverter can include two power transistors 510, 511 that provide two directions for current to flow when the control signal C is applied with respect to C'. By eliminating the additional diodes, there is also no reverse recovery affecting efficiency.

FIG. 6 illustrates an example inverter power stage. The example inverter power stage has a direct three phase inverter with six switches implemented using the example uni-directional switch configuration of FIG. 5A. According to the illustrated implementation (and indicated in FIG. 4A), the first switch 401 is assigned as Q1, the second switch 402 is assigned as Q3, the third switch 403 is assigned as Q5, the fourth switch 404 is assigned as Q4, the fifth switch 405 is assigned as Q6, and the sixth switch 406 is assigned as Q2.

Referring to both FIG. 4A and FIG. 6, pairs of the switches are connected at one end to a phase input from a three phase power supply such as the example power supply configurations of wyes and delta respectively shown in FIGS. 4B and 4C. In this example switches 401 (Q1) and 404 (Q4) are connected to the first phase input A (voltage signal Va), switches 402 (Q3) and 405 (Q6) are connected to the second phase input B (voltage signal Vb), and switches 403 (Q5) and 406 (Q6) are connected to the third phase input C (voltage signal Vc). The other ends of each of the switches are coupled to a resonant tank 408.

As shown in FIG. 4A, an inverter controller 410 provides the control signals to turn on and off each of the six switches 401, 402, 403, 404, 405, and 406. Here, a first output c1 is coupled to the first switch 401, a second output c2 is coupled to the second switch 402, a third output c3 is coupled to the third switch 403, a fourth output c4 is coupled to the fourth switch 404, a fifth output c5 is coupled to the fifth switch 405, and a sixth output c6 is coupled to the sixth switch 406. These control signals (c1, c2, c3, c4, c5, and c6) can correspond to gate control signals G1, G2, G3, G4, G5, and G6 as shown in FIG. 6 (and referenced in FIG. 8).

Additionally, the inverter controller 410 optionally uses current and/or power sensing feedback 411 from the resonant tank 408 to adjust the control signals.

Figure 7:
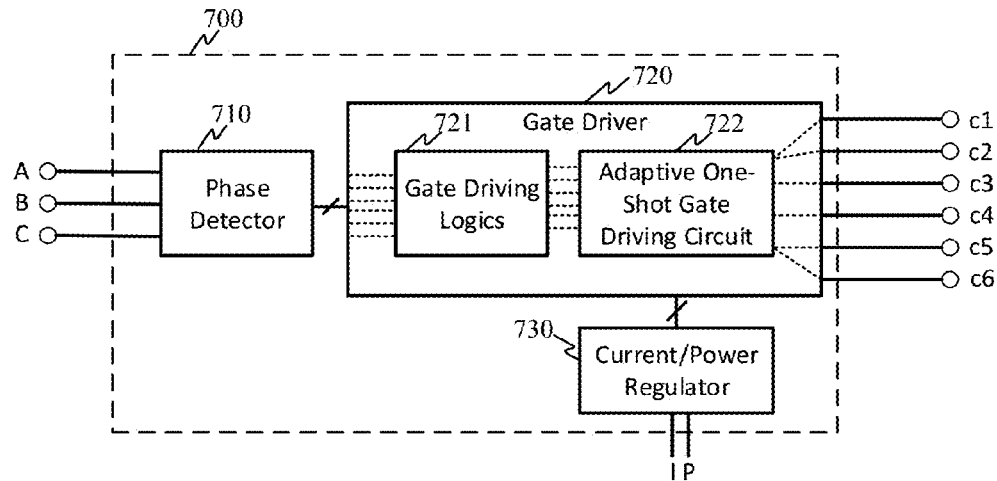
FIG. 7 illustrates an example inverter controller.

FIG. 7 is an example inverter controller. The illustrated example inverter controller can implement the inverter controller 410 illustrated in FIG. 4A as an example. Referring to FIG. 7, an example implementation of an inverter controller 700 includes a phase detector 710 that receives the three phase input signal A, B, and C from the three phase power source and a gate driver 720 that outputs appropriate control signals c1, c2, c3, c4, c5, and c6 based on the detected phase output from the phase detector 710 and, optionally, the signal from a current or power regulator 730. When packaged together with the direct three phase inverter (e.g., as in the example illustrated in FIGS. 2A and 2C), the phase detector 710 can receive the three phase input signals from a same input power line(s). When packaged separately from the direct three phase inverter (e.g., as in the example illustrated in FIG. 2B), separate connections to the three phase input signal A, B, and C are used.

The gate driver 720 can include gate driving logics 721 and an adaptive one-shot gate driving circuit 722. Additional detail regarding the adaptive one-shot gate driving circuit 722 and method related thereto is provided in reference to FIGS. 10A and 10B. The current or power regulator 730 enables the inverter controller to monitor the current (I), power (P), or both current and power, and maintain, compensate or otherwise adjust the output current (and/or power).

Figure 8:
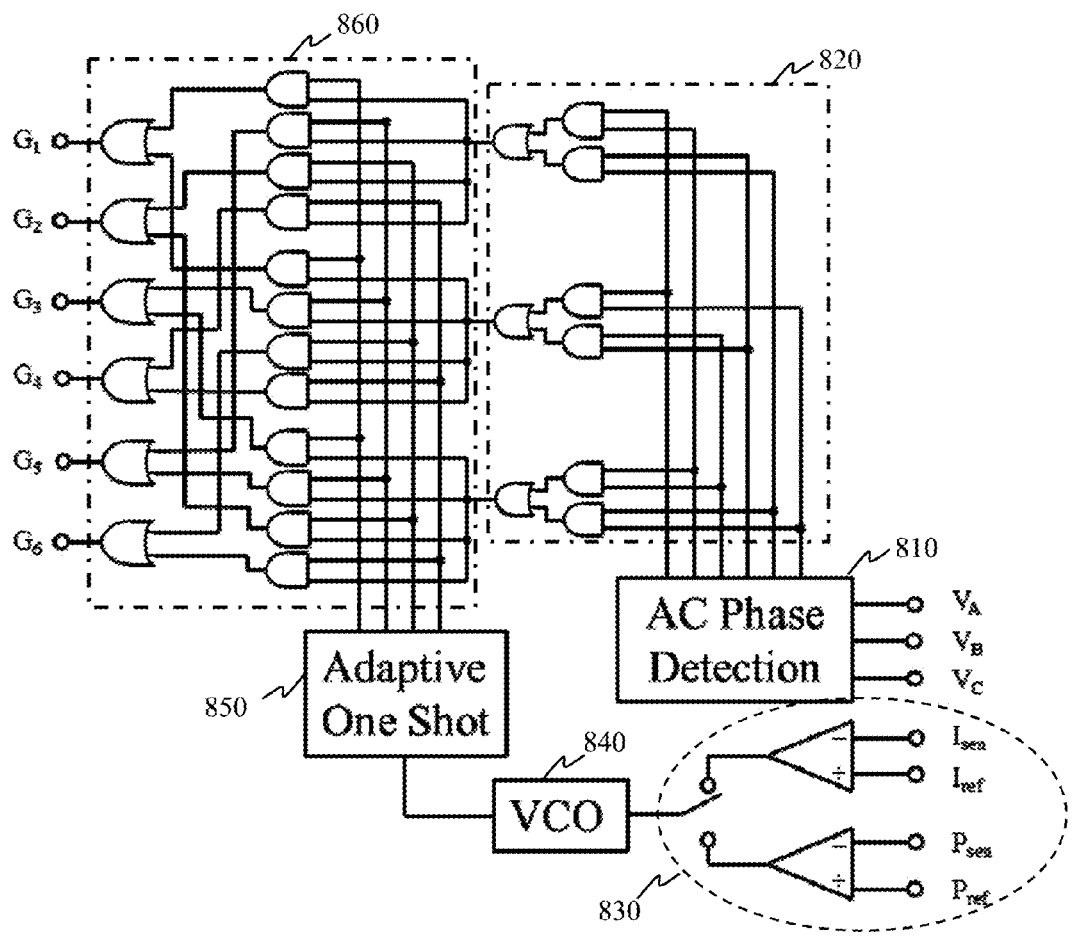
FIG. 8 illustrates an example implementation of an inverter controller.

FIG. 8 illustrates an example implementation of an inverter controller such as inverter controller 700. As shown in FIG. 8, the three phase input signal (via $V_A$, $V_B$, and $V_C$) is detected using logic or processor for AC Phase Detection 810, the output of which providing six signals to gate driving logic 820 that controls which gates to drive according to the appropriate phase region. Feedback in the form of sensed current and sensed power from the output of a direct three phase inverter is provided to a comparator 830 and voltage controlled oscillator (VCO) 840 to facilitate adjustments for output current and/or output power. The output of the VCO 840 is used to trigger an adaptive one shot circuit 850 (discussed in more detail with respect to the specific implementation shown in FIGS. 14A-14F). The pulse signal generated by the adaptive one shot circuit 850 and the output of the gate driving logic 820 are used as input to the adaptive one-shot gate drivers 860 that generate control signals (e.g., G1, G2, G3, G4, G5, G6) for the switches.

Figure 9:
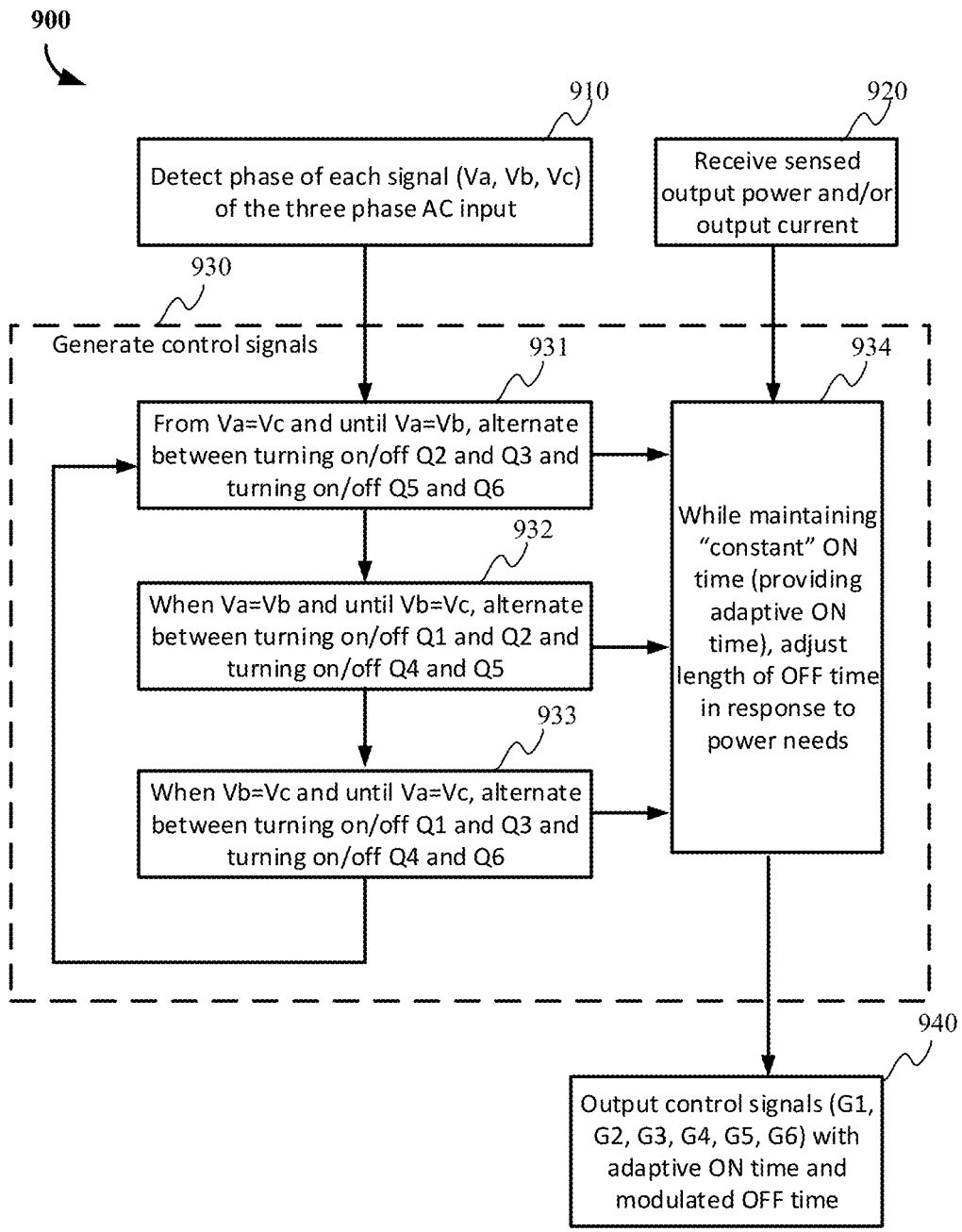
FIG. 9 illustrates an example process carried out by an inverter controller.

FIG. 9 illustrates an example process carried out by an inverter controller. Referring to FIG. 9, a process 900 can be carried out at an inverter controller such as described with respect to any of FIGS. 4A, 7, and 8 to facilitate the direct three phase parallel resonant inverter for reactive gas generating applications. Indeed, process 900 (and thereby the inverter controller) can be implemented using a microprocessor, digital signal processor (DSP), complex programmable logic device (CPLD), field programmable gate array (FPGA), logic, or a combination thereof.

The inverter controller can detect the phase of each signal (e.g., Va, Vb, Vc shown in FIGS. 6 and 8) of the three-phase ac input (910). This may be carried out, for example, using phase detector 710 of FIG. 7 or phase detector 810 of FIG. 8. The inverter controller can further receive sensed output power and/or output current (920). The output power, output current, or both output power and output current can be detected via circuitry coupled to the output of the direct three phase inverter (e.g., via a current or power regulator 730 connected to a load including resonant tank and/or plasma generator). Based on the detected phase (and the sensed power and/or current output), control signals can be generated (930).

According to an implementation, generating the control signals includes, from the time when Va is equal to Vc, and until the time when Va is equal to Vb (where Va, Vb, and Vc are the phases detected previously in 910), alternating between turning on Q2 and Q3 and turning on Q5 and Q6 so that Q2 and Q3 are on while Q5 and Q6 are turned off and vice versa (931). Then, from the time when Va is equal to Vb, and until the time when Vb is equal to Vc, alternating between turning on Q1 and Q2 and turning on Q4 and Q5 so that Q1 and Q2 are on while Q4 and Q5 are turned off and vice versa (932). Then, from the time when Vb is equal to Vc, and until the time when Va is equal to Vc, alternating between turning on Q1 and Q3 and turning on Q4 and Q6 so that Q1 and Q3 are on while Q4 and Q6 are turned off and vice versa (933). As Va is detected to be equal to Vc (and while the system is in operation), steps 931, 932, and 933 repeat.

During this time, the received sensed output power and/or output current are used to adjust the length of OFF time in response to power needs while providing an adaptive ON time (934). The signals identifying which of the transistors should be turned on are combined with the driving signal generated from step 934 to output control signals with modulated OFF time (940). In addition, even though a pair of switches may be identified at steps 931, 932, and 933 to be turned on, the driving signal may actually not have both switches ON at the same time. An adaptive one shot circuit can be used to facilitate the "constant" ON time control with modulated OFF time. This process enables a constant ON time control where the OFF time is modulated and the ON time is adapted (for adaptive ON time).

As an illustrative example, an inverter controller, can monitor the three phases Va, Vb, and Vc; and, in response to an indication of Va=Vc and until Va=Vb, generate a signal maintaining the Q1 and Q4 in an OFF state, alternatingly generate a signal indicating both Q2 and Q3 are active and both Q5 and Q6 are active, and generate the appropriate driving signals to the active pair. The control signals for Q2, Q3, Q5, and Q6 can have a constant ON time, but an OFF time based on desired output power or output current. In addition, in response to an indication of Va=Vb and until Vb=Vc, the inverter controller can generate a signal maintaining Q3 and Q6 in the OFF state, alternatingly generate a signal indicating both Q1 and Q2 are active and both Q4 and Q5 are active, and generate the appropriate driving signals to the active pair. The control signals for Q1, Q2, Q4, and Q5 have a constant ON time, but an OFF time based on desired output power. Then, in response to an indication of Vb=Vc and until Vc=Va, the inverter controller can generate a signal maintaining Q2 and Q5 in the OFF state, alternatingly generate a signal indicating that both Q1 and Q3 are active and both Q4 and Q6 are active, and generate the appropriate driving signals to the active pair.

FIGS. 10A and 10B illustrate adaptive ON time control. In particular, FIGS. 10A and 10B provide a snapshot comparison of signals occurring, for example, during the time of either step 932 or 933 of FIG. 9 and in response to step 934 of FIG. 9 when applied to a system including a direct three phase inverter such as shown in FIG. 6. That is, Q1 and Q4 are turned on and off with gate control signals G1 and G4, where the length of OFF time is adjusted in response to power needs (e.g., for plasma applicator 110) while maintaining "fixed" ON time (of an adaptive, constant ON time). Here, the power needs are shown as a "low" plasma power of 4 kW and a "high" plasma power of 8 kW. First, referring to FIG. 10A, voltage-time graphs of the gate control signals G1 and G4 output at step 940 of FIG. 9 shows the ON time for G1 and G4 as about 2 µs and OFF time as about 6 µs (see voltage-time plot for G4). The corresponding voltage (Vds) and current (I(Rds)) across the transistors Q1 and Q4 are illustrated in the V/I plots.

As a comparison, the length of OFF time can be modulated (for example using an adaptive one-shot circuit) and the results shown in FIG. 10B. Referring to FIG. 10B, it can be seen that the ON time for G1 and G4 remains about 2 µs; however, the OFF time has been adjusted to about 3 µs, which is half of the OFF time of the scenario shown in FIG. 10A. The doubling of the power output (from 4 kW to 8 kW) can be achieved by this shortening of the OFF time. With the constant ON time, the current through the transistor can be more easily minimized (and provide a more consistent output) both at the turning on and turning off of the transistor.

Figure 11A:
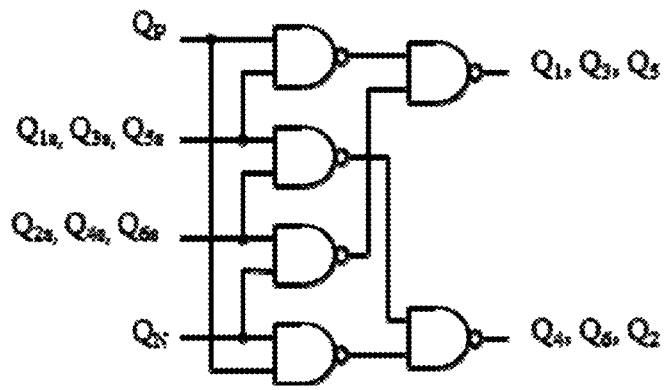
FIG. 11A illustrates a simplified control logic for basic driver operation.
Figure 11B:
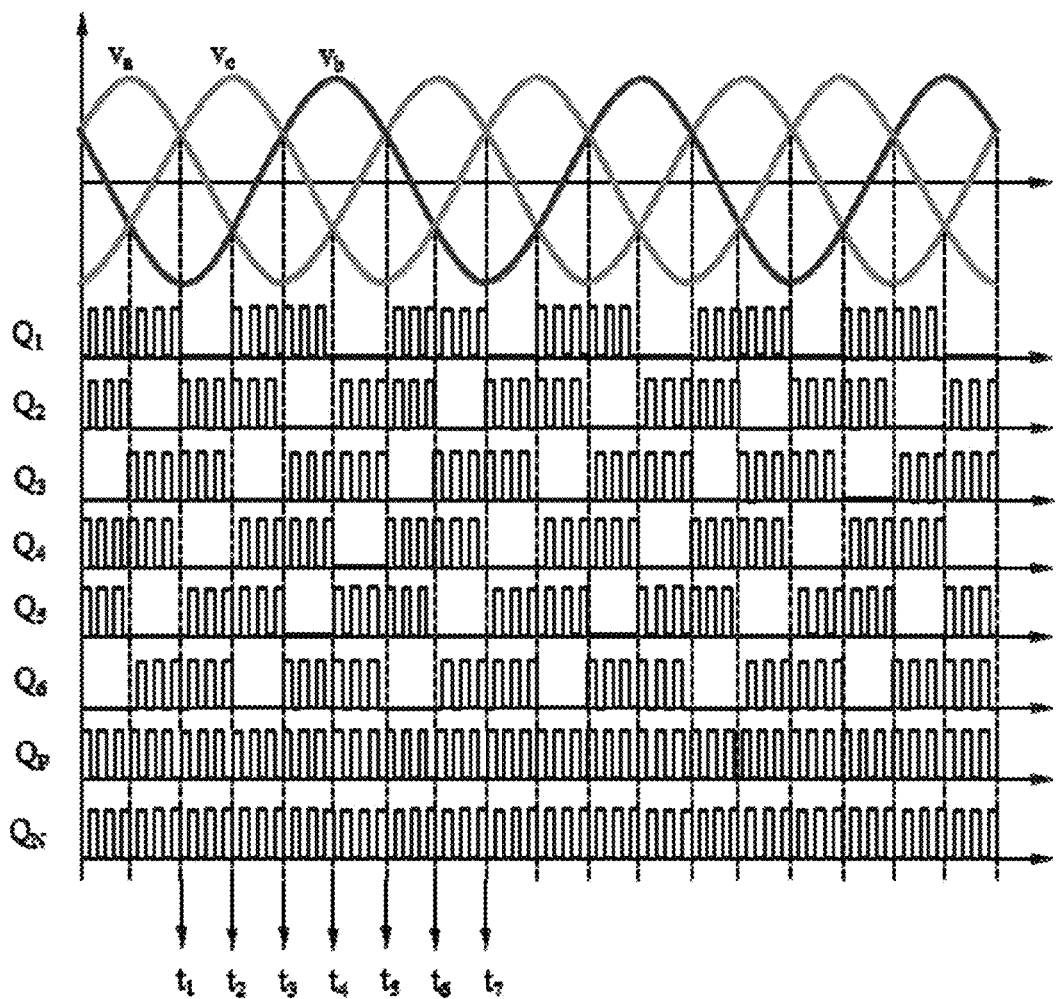
FIG. 11B provides a timing diagram representation for the basic driver operation of the simplified control logic of FIG. 11A.

FIG. 11A illustrates a simplified control logic for basic driver operation; and FIG. 11B provides a timing diagram representation for the basic driver operation of the simplified control logic of FIG. 11A. The control logic 1100 may be implemented at an inverter controller. Here, the control logic 1100 receives signals Q1s, Q2s, Q3s, Q4s, Q5s, and Q6s for selecting particular switches to turn on and off at the inverter. These signals may be based on a detected phase of the three phase AC supply, illustrated as Va, Vb, and Vc in the timing diagram of FIG. 11B. In addition, the control logic 1100 receives clock signals QP and QN. It can be noted that when the implementation includes an adaptive one shot circuit, the clock signals QP and QN for this basic driver operation can be replaced with the pulses from the adaptive one shot circuit. The output of the control logic 1100 drives the switches Q1, Q2, Q3, Q4, Q5, and Q6 as illustrated in FIG. 11B.

Figure 12:
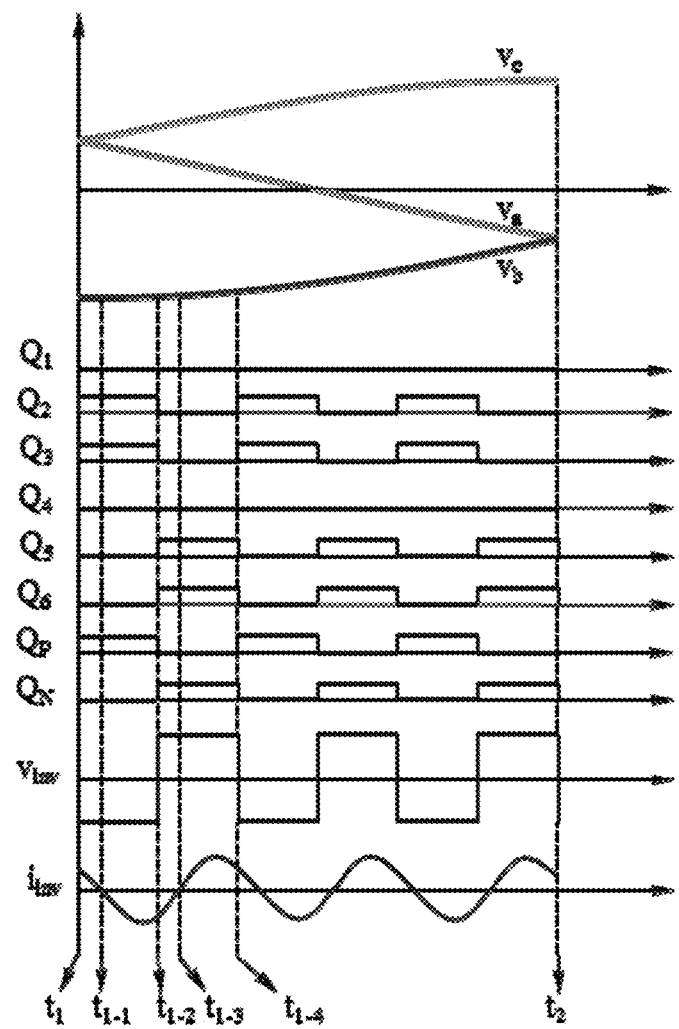
FIG. 12 provides a detailed snapshot of the simplified timing diagram of FIG. 11B from t1 to t2.
Figure 13A:
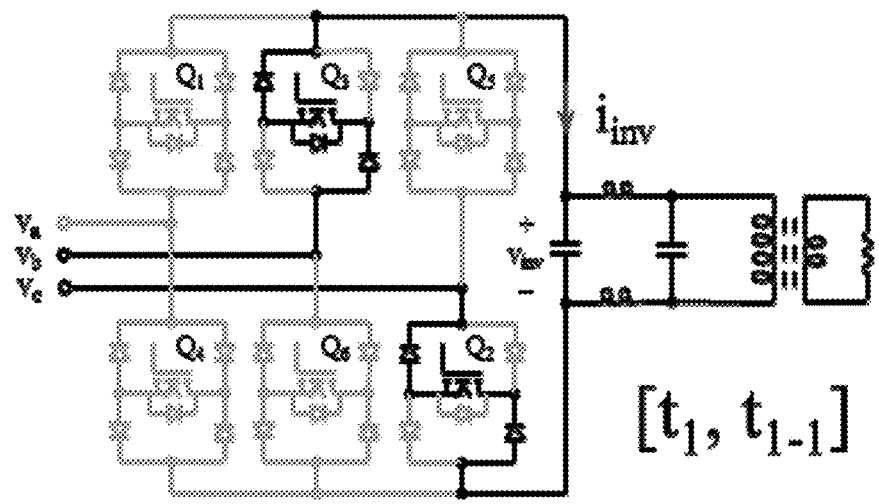
FIGS. 13A-13D illustrate current flow and operation of an inverter in response to the gate driving logic operations shown in the simplified timing diagram of FIG. 12.
Figure 13B:
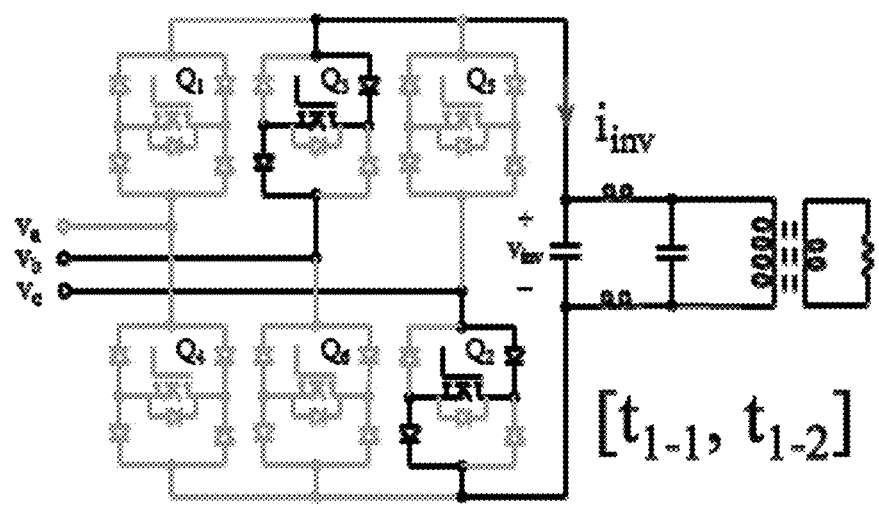
Figure 13C:
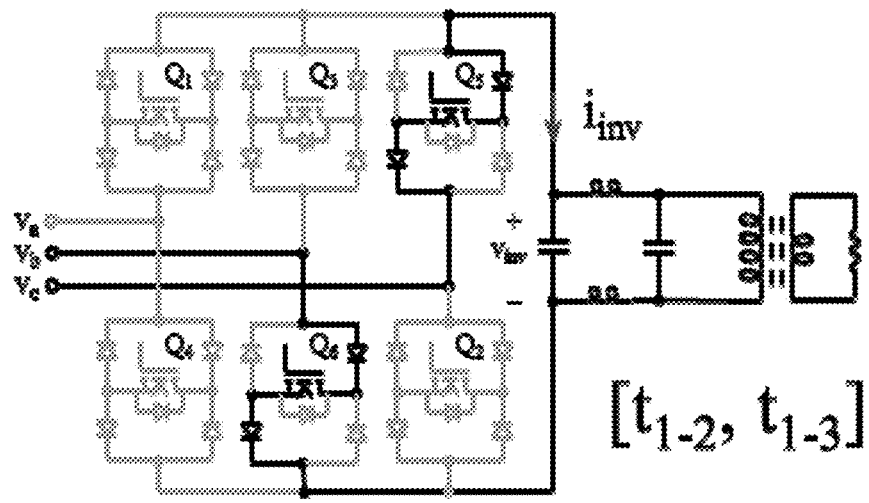
Figure 13D:
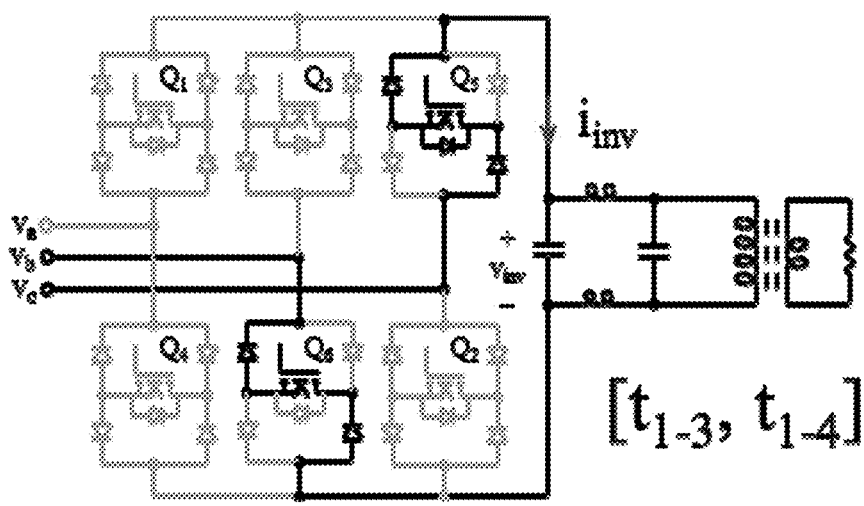

FIG. 12 provides a detailed snapshot of the simplified timing diagram of FIG. 11B from t1 to t2; and FIGS. 13A-13D illustrate current flow and operation of an inverter in response to the gate driving logic operations shown in the simplified timing diagram of FIG. 12. The simplified timing diagram of FIG. 12 also shows the inverter's output voltage (Vinv) and output current (Iinv). The operation of the inverter can be identified by particular windows of time, which are reflected in the FIGS. 13A-13D. Here, FIG. 13A illustrates the inverter operation during $t_1$ to $t_{1-1}$, where Q2 and Q3 are ON and current is "positive" (in the direction of the arrow). Next, FIG. 13B illustrates the inverter operation during $t_{1-1}$ to $t_{1-2}$, where Q2 and Q3 are still ON, but the current becomes negative (see change in signal path through diodes). Then, from $t_{1-2}$ to $t_{1-3}$, Q5 and Q6 are turned on, Q2 and Q3 are turned OFF and the current is still negative (based on signal path through diodes), as shown in FIG. 13C. Then, as shown in FIG. 13D, from $t_{1-3}$ to $t_{1-4}$, Q5 and Q6 remain ON, but the current becomes positive again. This sequence continues to repeat from $t_{1-4}$ to $t_2$.

EXAMPLE SIMULATIONS

Figure 14A:
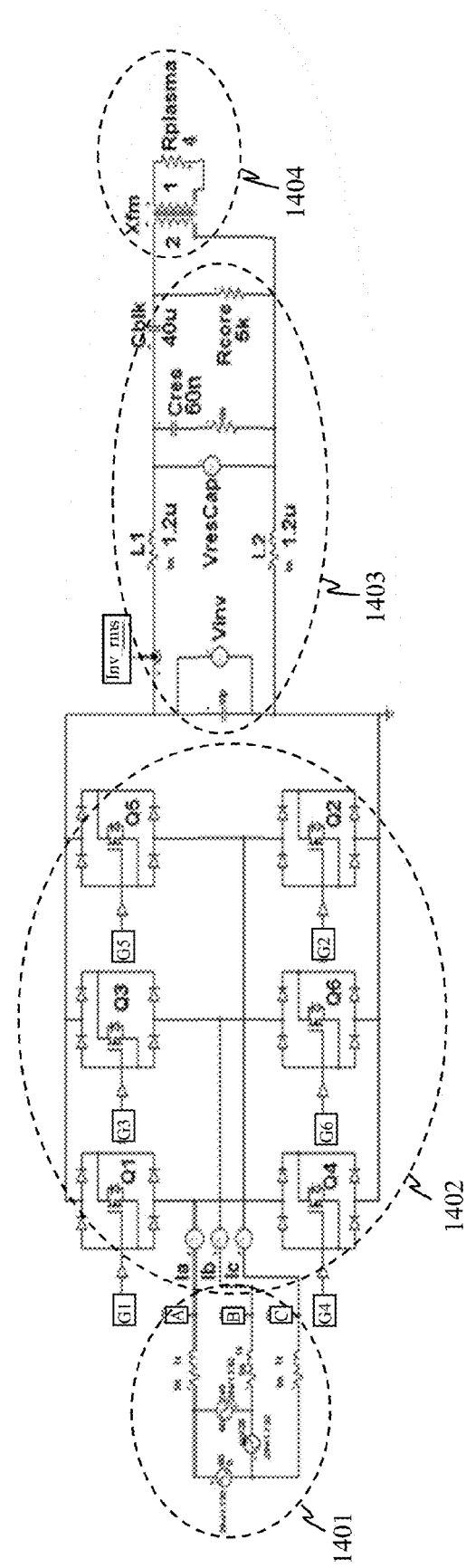
FIGS. 14A-14F show a schematic of a plasma generating system with a direct three phase parallel resonant inverter from which simulations were carried out.
Figure 14B:
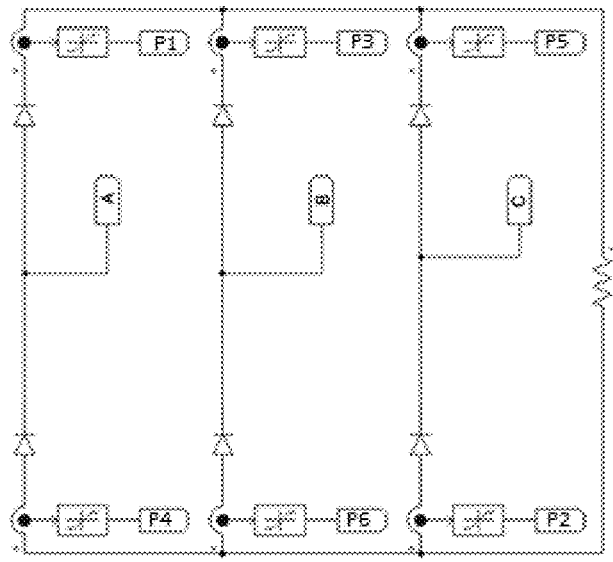
Figure 14C:
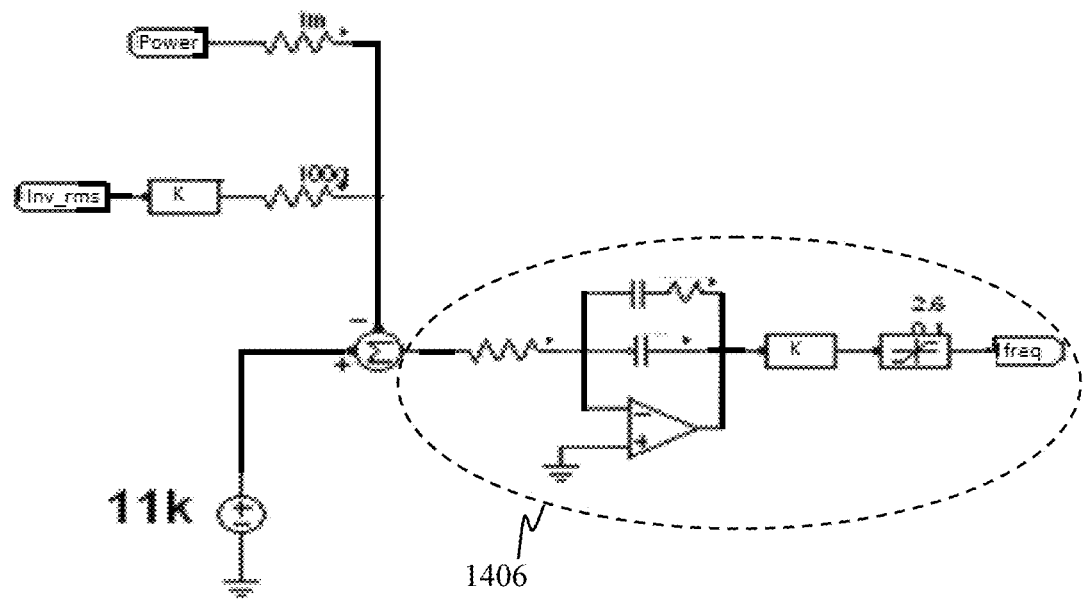
Figure 14D:
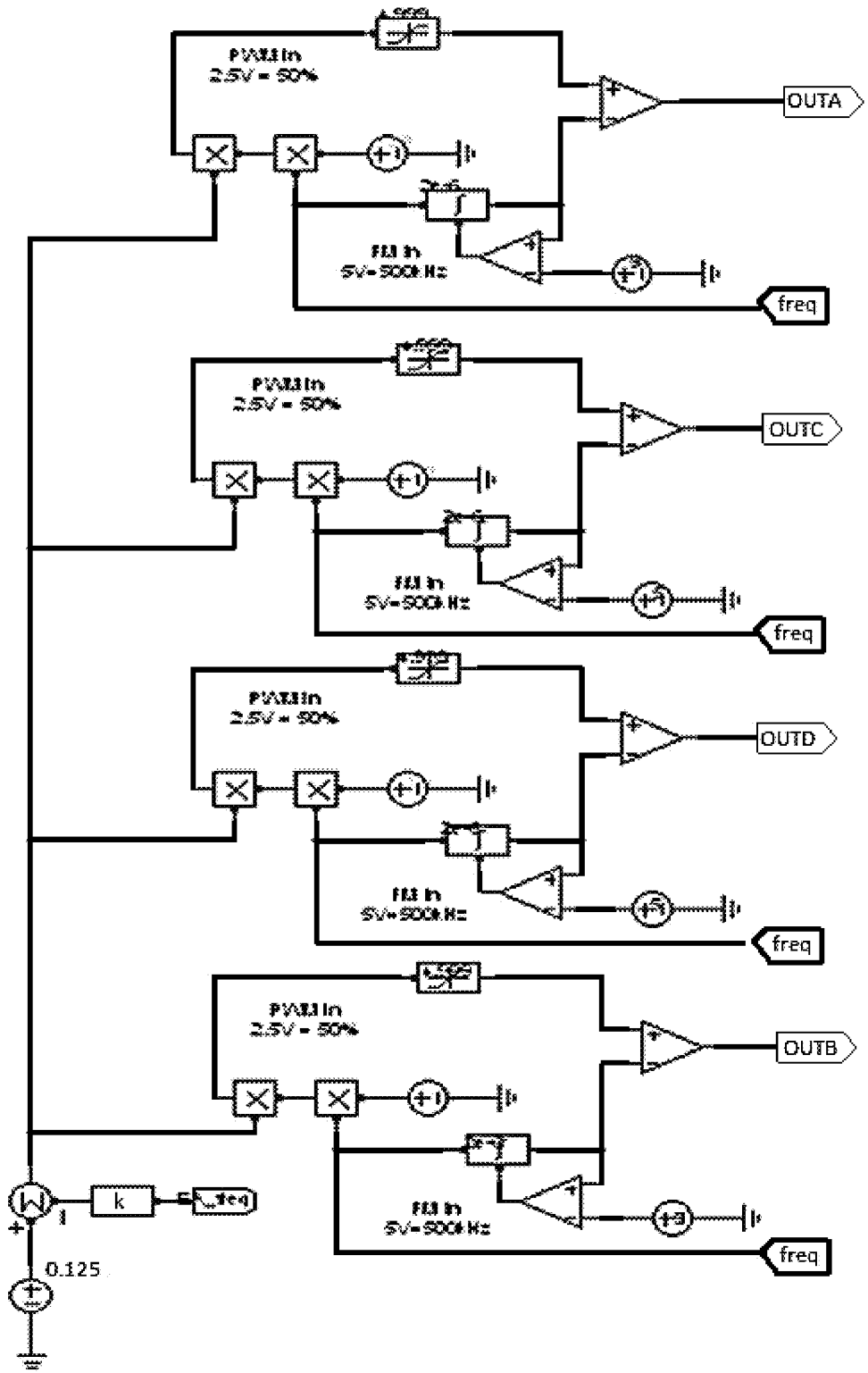

FIGS. 14A-14F show a schematic of a plasma generating system with a direct three phase parallel resonant inverter from which simulations were carried out. FIG. 14A shows a simulated three phase 208 VAC supply 1401, direct three phase inverter 1402 with six switches (see also FIG. 6), a parallel resonant tank 1403 (see also e.g., FIG. 3A), and simulated plasma applicator 1404. FIG. 14B shows a simulated three phase 208 VAC phase detector 1405 that couples to the A, B, and C nodes of the simulated three phase 208 VAC supply 1401 and outputs P1, P2, P3, P4, P5, and P6 signals that are used by the initial stage 1411 of the driving circuit 1410 shown in FIG. 14E. FIG. 14C shows a simulated Isense/Psense power/current loop from a plasma generator (from Inv_rms of 14A) and power/current loop compensator (PI Comp) 1406. Depending on the configuration, a power loop or current loop from the plasma generator may be used. As illustrated in the example shown in FIG. 14C, the power loop (from input node "Power") is closed and the output of the proportional plus integral controller (the PI Comp 1406) is a frequency command. The output of the PI Comp 1406 provides the frequency command of frequency signal/clock (freq) for the one shot timer 1407 for adaptive one-shot and adaptive ON time (VCO) shown in FIG. 14D. Referring to FIG. 14D, after receiving the frequency command, the output of the one shot timer 1407 includes OUTA, OUTB, OUTC, and OUTD, which are signals used by the one shot gate driving circuit stage 1412 (see also e.g., FIG. 11A which uses clock signals instead of the adaptive one-shot) of the driving circuit 1410 shown in FIG. 14E.

Figure 14E:
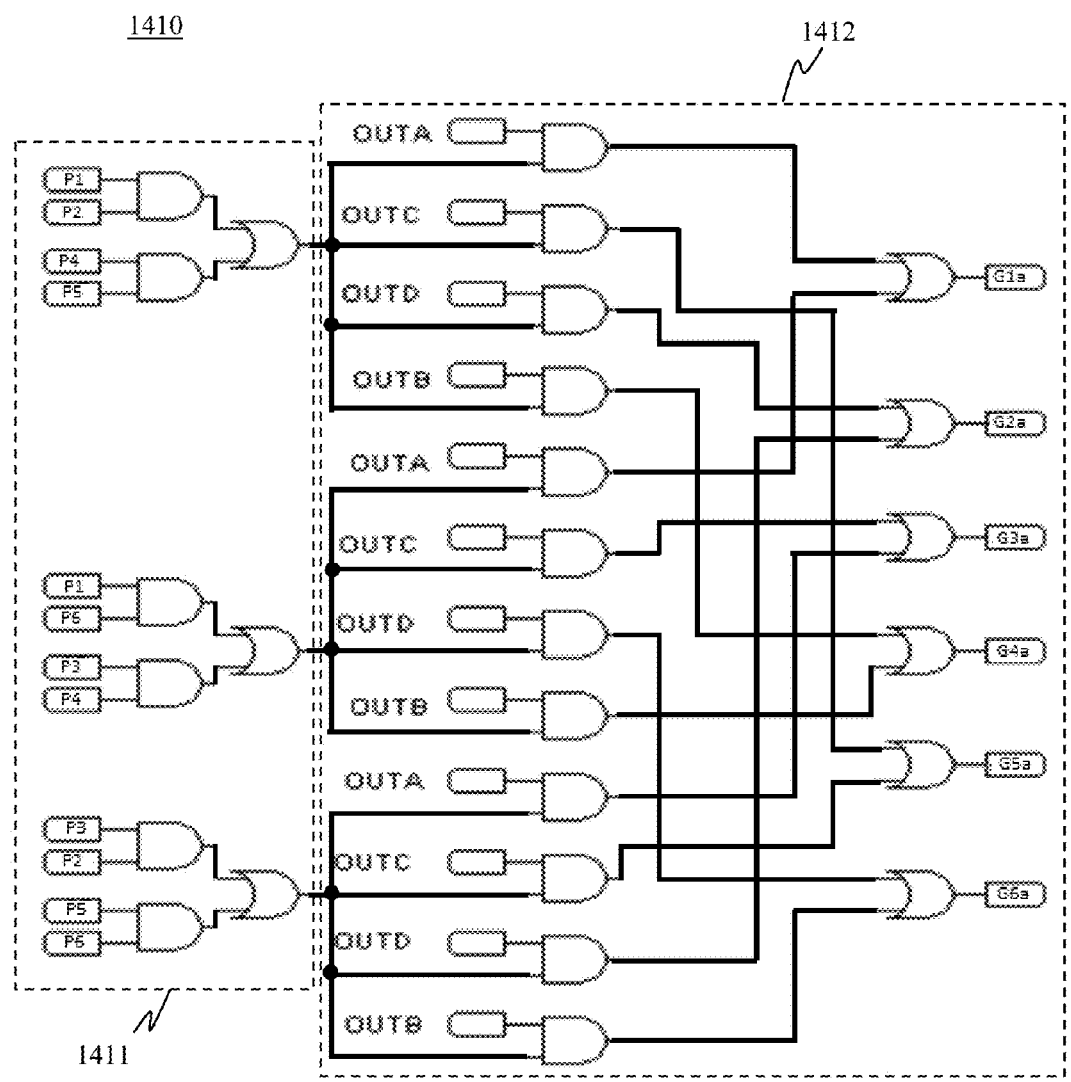
Figure 14F:
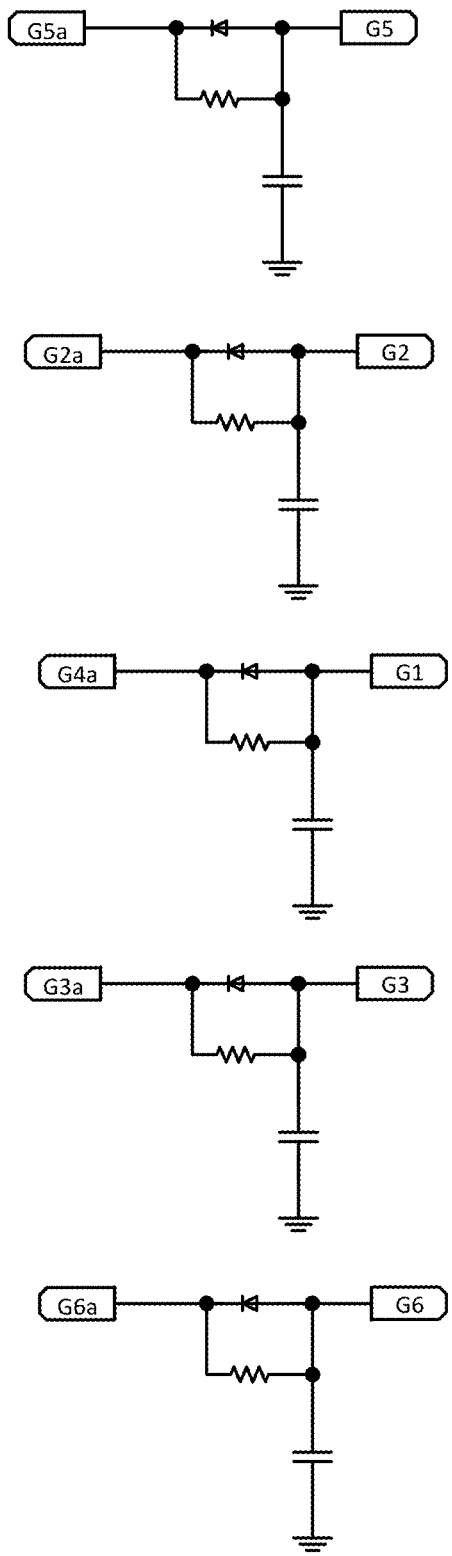

As shown in FIG. 14E, the driving circuit receives the outputs indicative of the phase (P1, P2, P3, P4, P5, and P6) and the outputs of the one shot timer (OUTA, OUTB, OUTC, and OUTD to generate intermediate gate control signals G1a, G2a, G3a, G4a, G5a, and G6a. FIG. 14F shows the driver output rectifier that receives the intermediate gate control signals G1a, G2a, G3a, G4a, G5a, and G6a and outputs the gate control signals G1, G2, G3, G4, G5, and G6.

Figure 15A:
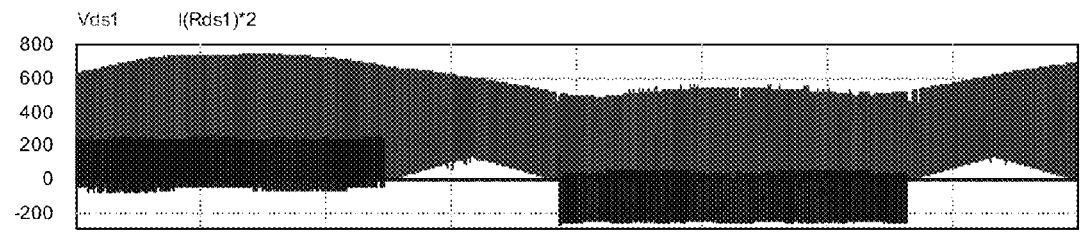
FIGS. 15A-15K show plots of simulation results from the schematic of FIGS. 14A-14F for a full 15 kW output load.
Figure 15B:
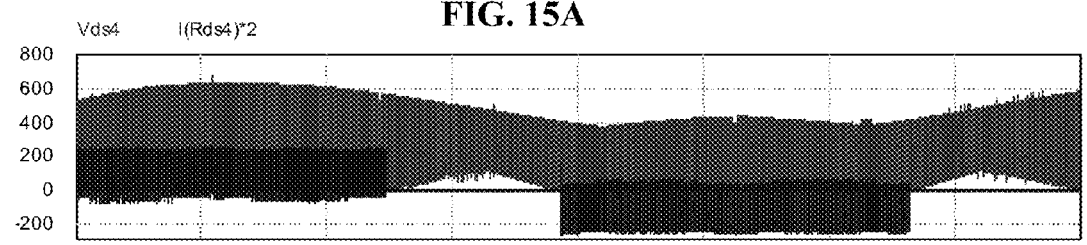
Figure 15C:
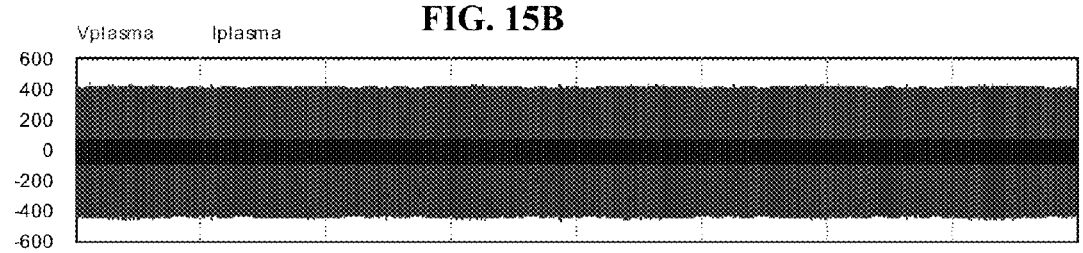
Figure 15D:
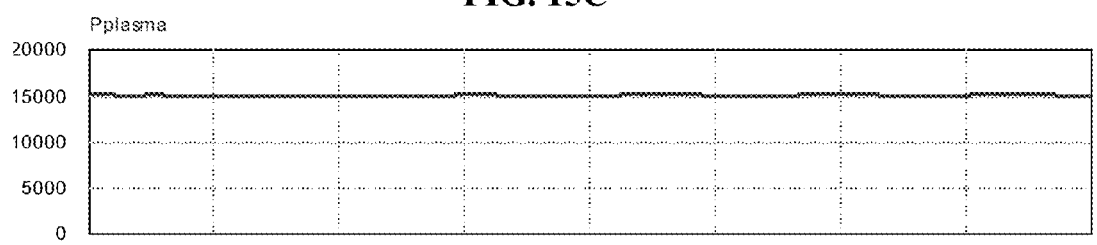
Figure 15E:
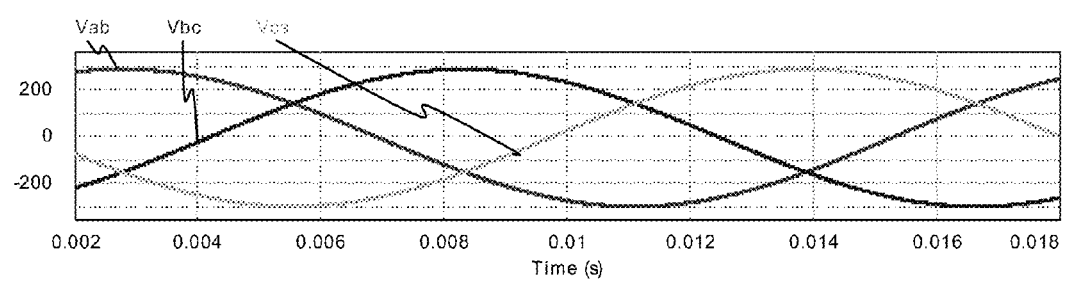
Figure 15F:
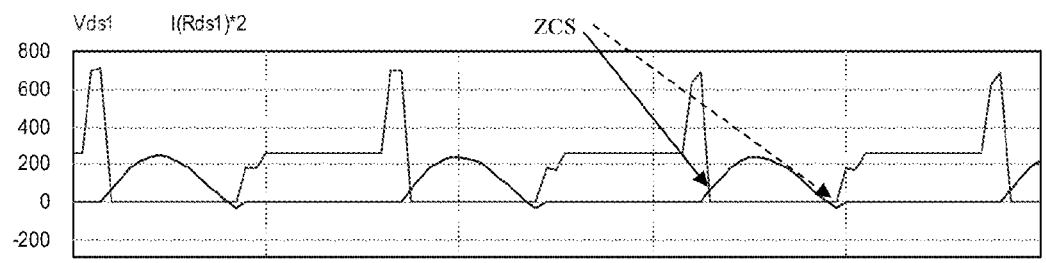
Figure 15G:
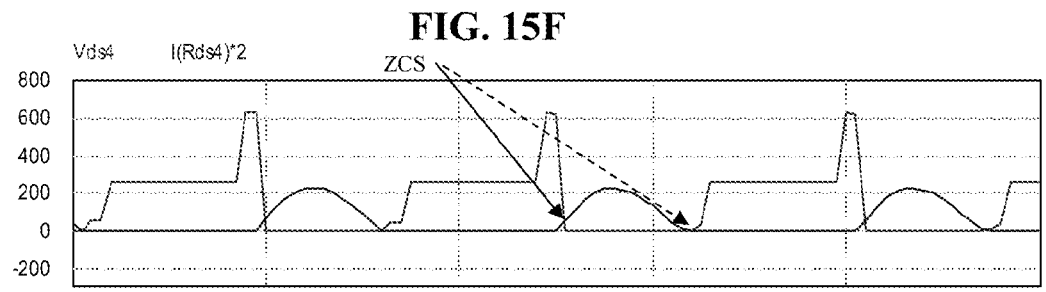
Figure 15H:
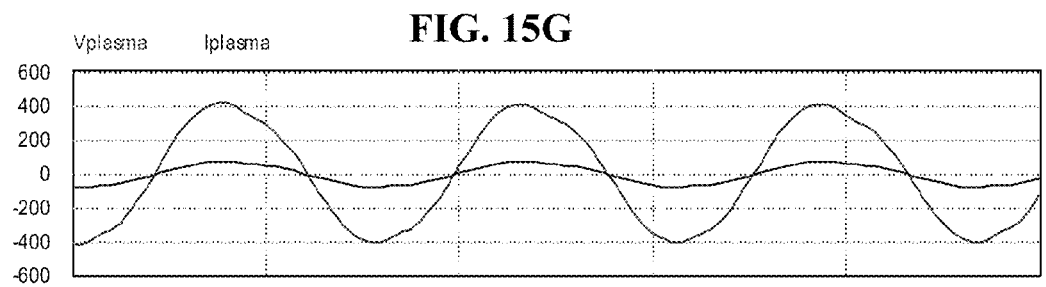
Figure 15I:
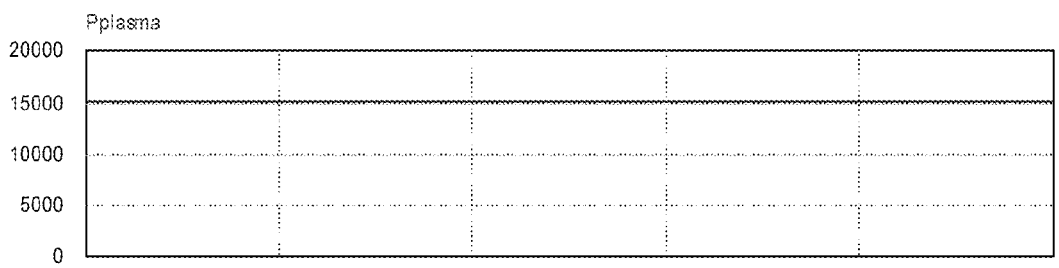
Figure 15J:
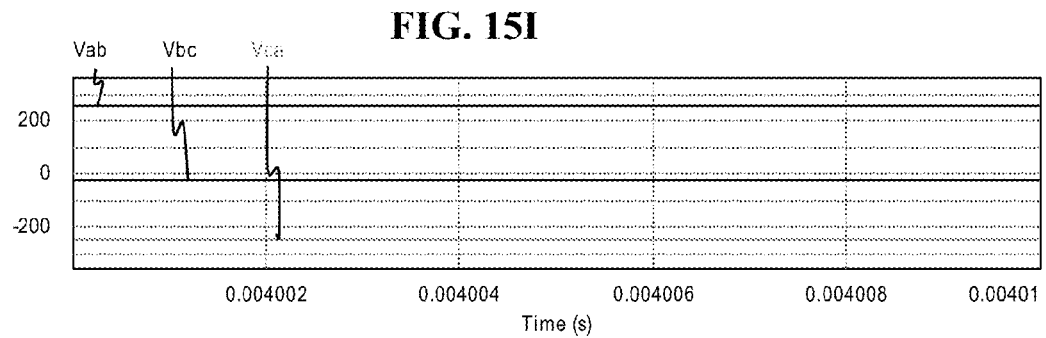
Figure 15K:
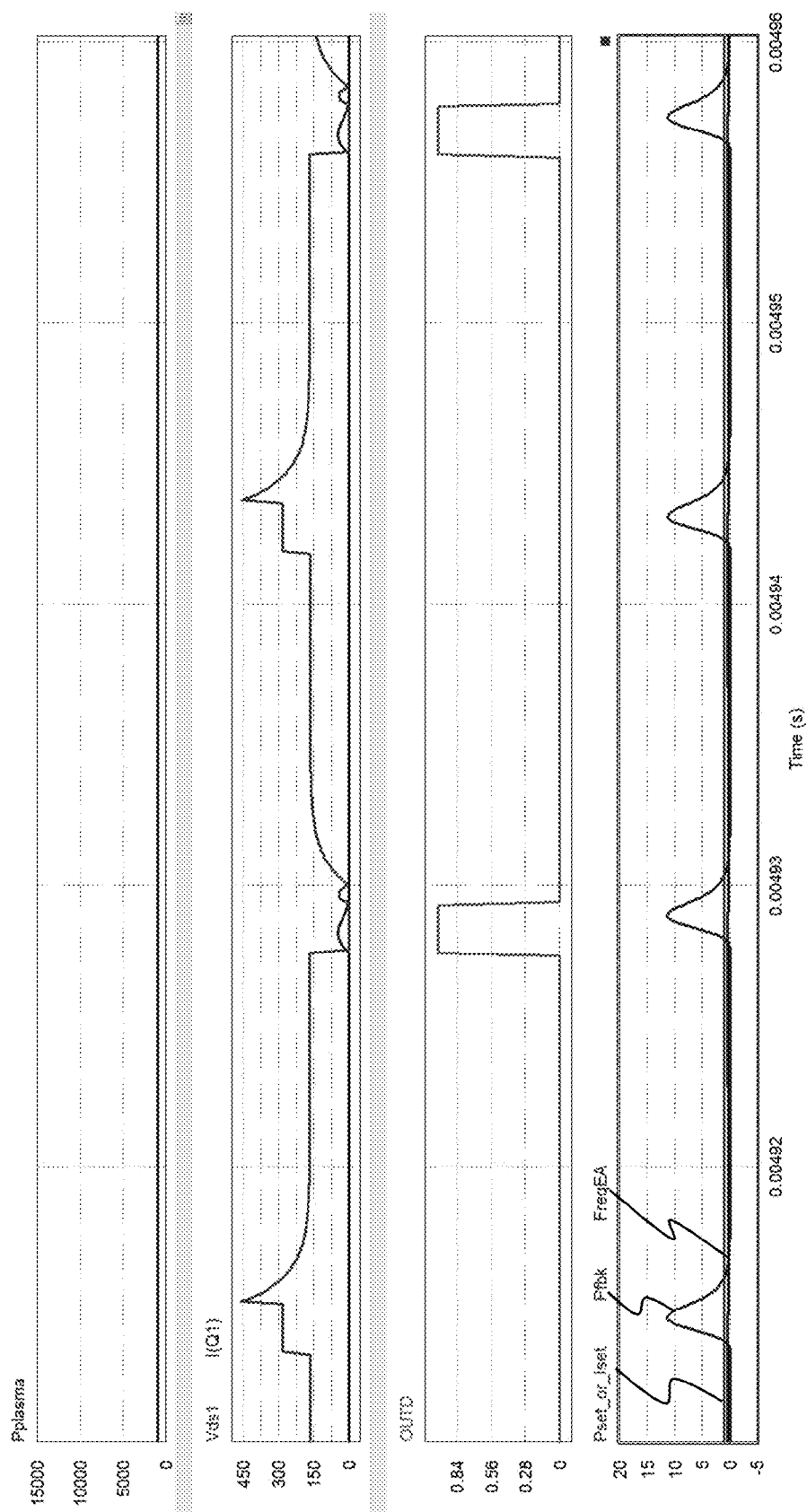
Figure 16A:
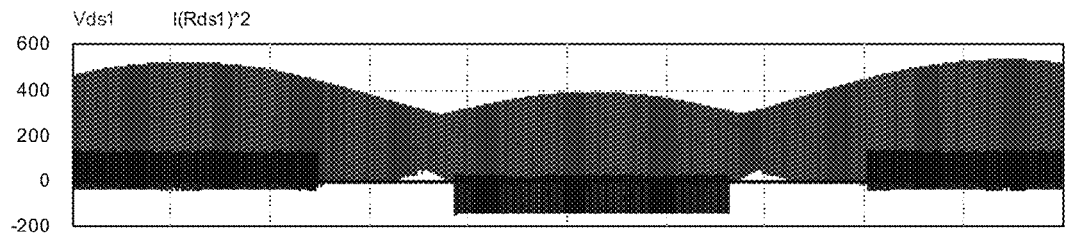
FIGS. 16A-16K show plots of simulation results from the schematic of FIGS. 14A-14F for a 5 kW output load.
Figure 16B:
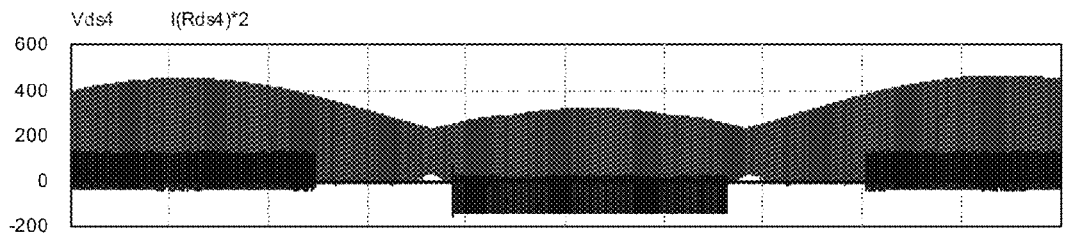
Figure 16C:
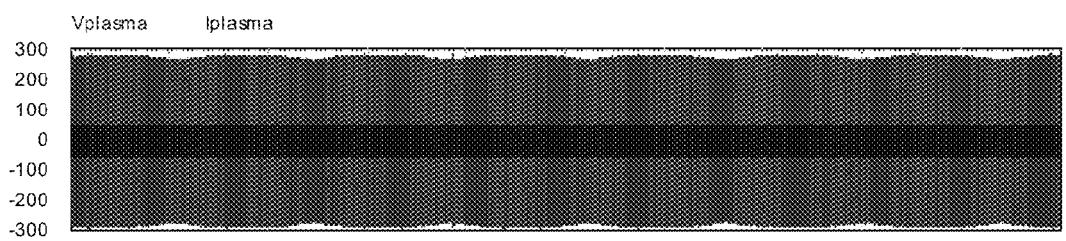
Figure 16D:
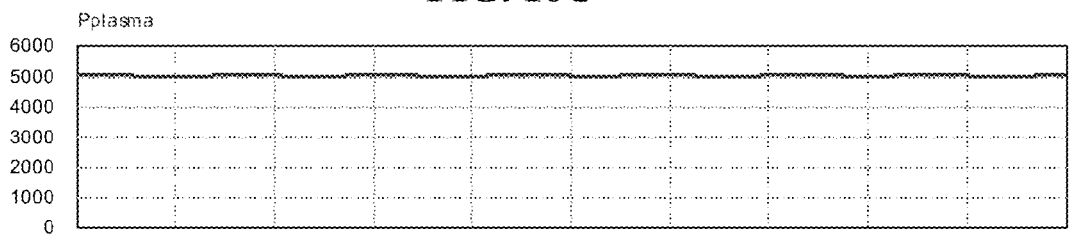
Figure 16E:
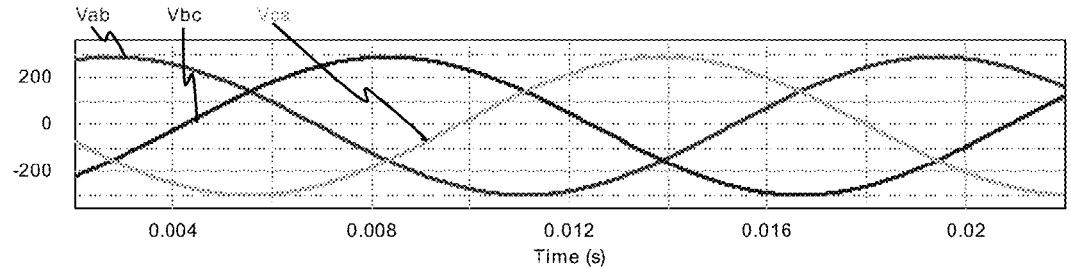

FIGS. 15A-15K show plots of simulation results from the schematic of FIGS. 14A-14F for a full 15 kW output load; and FIGS. 16A-16K show plots of simulation results from the schematic of FIGS. 14A-14F for a 5 kW output load. FIGS. 15A and 16A show the current and the voltage ($V_{DS}$) across transistor Q1 while the three phase 208VAC signals are as shown in FIGS. 15E and 16E; FIGS. 15B and 16B show, for the same window of time, the current and the voltage across transistor Q4, which is paired with Q1 in connection to one of the three phase signal lines from the power supply. FIGS. 15C and 16C show the voltage and current at the output of the plasma generator; and FIGS. 15D and 16D show the resulting output plasma power, confirming output power of 15 kW and 5 kW, respectively.

Figure 16F:
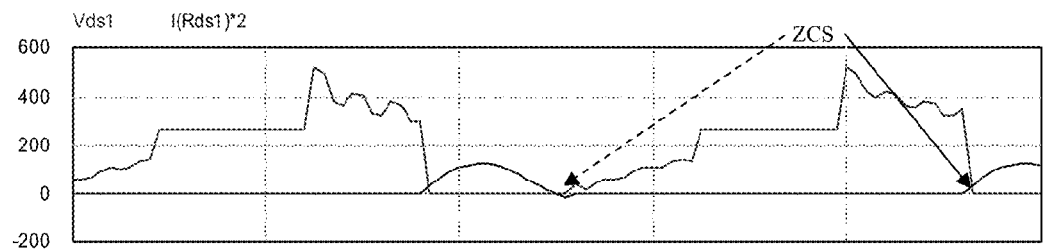
Figure 16G:
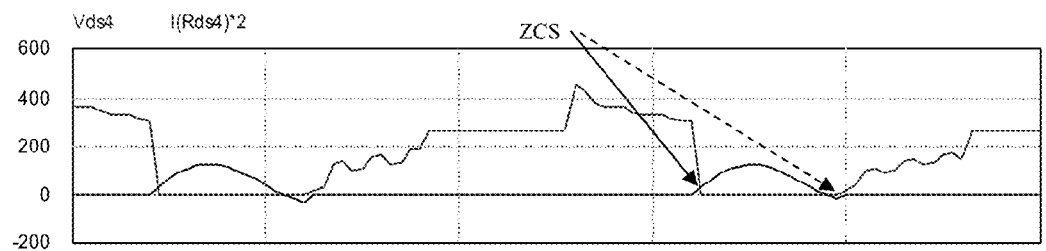
Figure 16H:
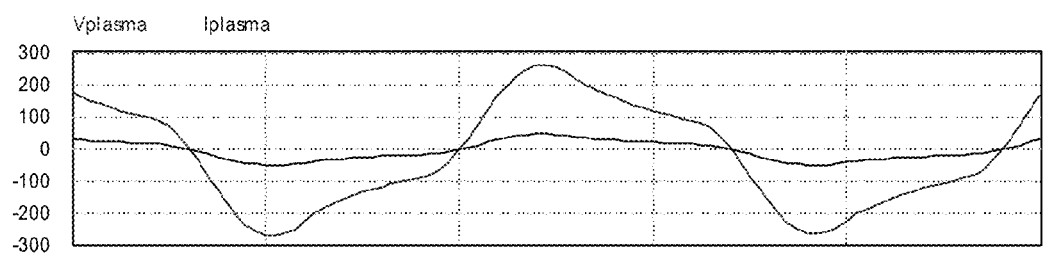
Figure 16I:
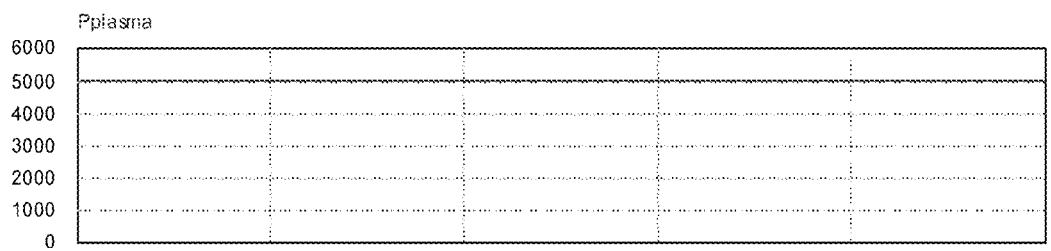
Figure 16J:
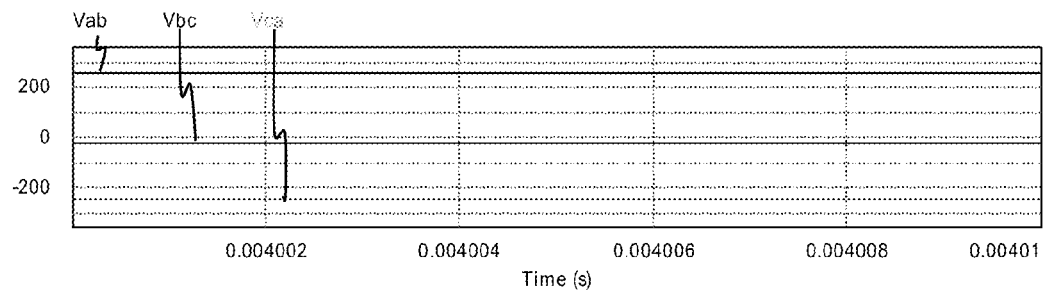

FIGS. 15F and 16F show a snippet of the current and voltage across transistor Q1 during the 10 µs window as shown in FIGS. 15J and 16J; and FIGS. 15G and 16G show a snipped of the current and voltage across transistor Q4 across this same window. FIGS. 15H and 16H show the plasma current and plasma voltage (for this window of time); and FIGS. 15I and 16I show the resulting output plasma power. As can be seen from where Ids and Vds cross in FIGS. 15F, 15G, 16F, and 16G, the power stage described in various implementations herein can achieve nearly zero current switching (ZCS) for both turn ON (see arrow with solid line) and turn OFF (see arrow with dotted line), and thereby provide lossless power devices power dissipation.

Figure 16K:
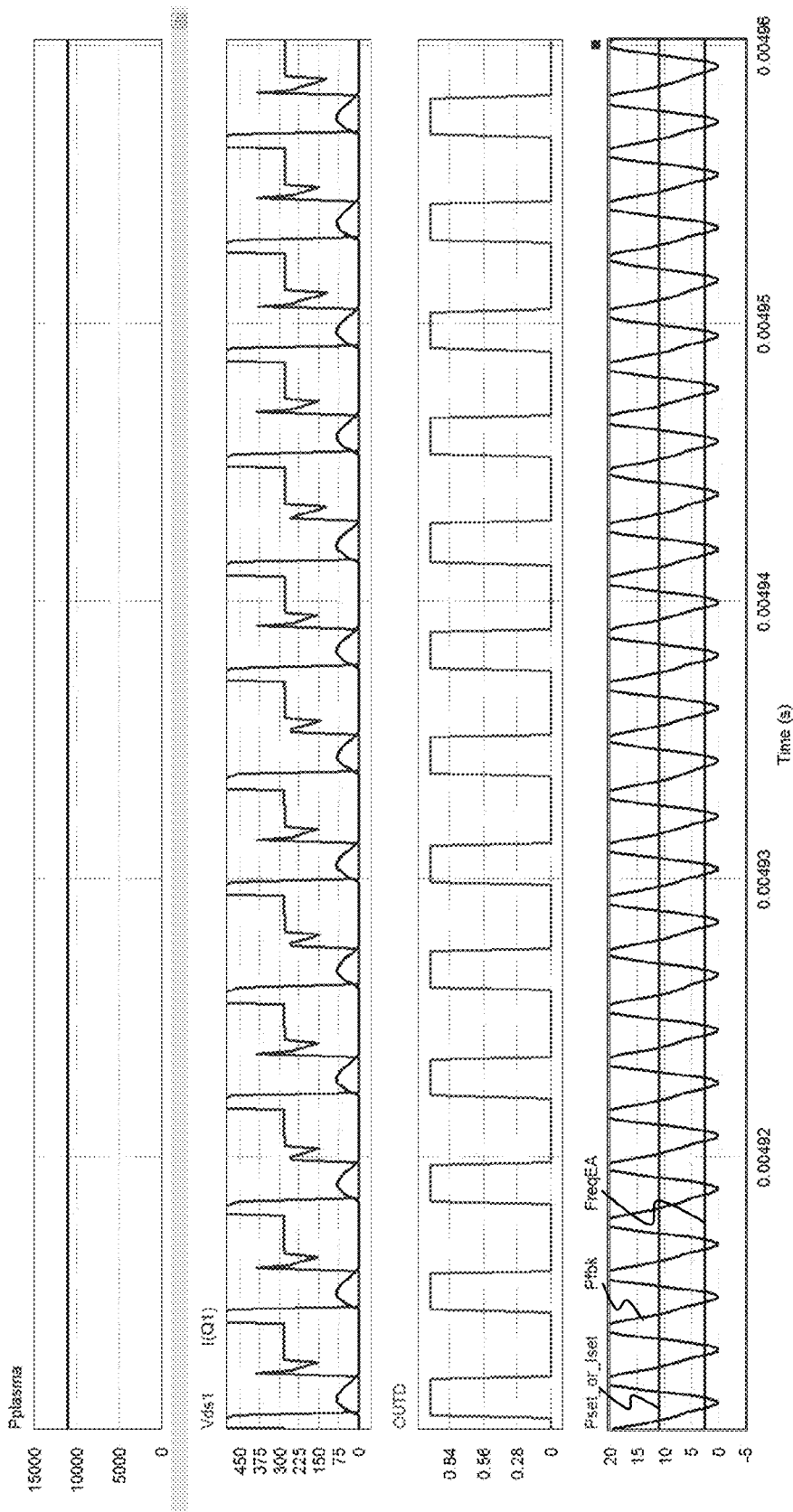

FIGS. 15K and 16K provide additional detail. The adaptive one-shot and adaptive ON time circuitry uses the frequency information from the signal freq to modulate the OFF time while slightly increasing the ON time at light loads. Referring to FIG. 15K, for a 1 kW plasma load, the ON time is 1.79 µs and the ON time is 26.5 µs at the one-shot timer signal OUTD (see FIG. 14D). At the heavier loads, such as for an 11 kW plasma load, the ON time in the simulation is 1.43 µs and OFF time is 2.39 µs at the one-shot time signal OUTD. Accordingly, it can be seen that the adaptive ON time circuitry (using the frequency control signal freq) results in the length of ON time to be relatively constant (with a slight change from 1.79 µs to 1.43 µs) while the OFF time is modulated from 26.5 µs to 2.39 µs.

Certain aspects of the invention provide the following non-limiting embodiments:

Example 1

A power system comprising: a direct three phase inverter having a first phase input line, a second phase input line, and a third phase input line for receiving a three phase AC input; and a resonant tank receiving an output of the direct three phase inverter.

Example 2

The power system of example 1, wherein the output of the direct three phase inverter is provided via a first output line and a second output line, wherein the direct three phase inverter comprises six uni-directional switches, one uni-directional switch connecting the first phase input line to the first output line, one uni-directional switch connecting the first phase input line to the second output line, one uni-directional switch connecting the second phase input line to the first output line, one uni-directional switch connecting the second phase input line to the second output line, one uni-directional switch connecting the third phase input line to the first output line, and one uni-directional switch connecting the third phase input line to the second output line.

Example 3

The power system of example 2, wherein each of the six uni-directional switches comprises a power transistor and four diodes.

Example 4

The power system of example 3, wherein the power transistor is a metal-oxide-semiconductor field-effect transistor, bipolar junction transistor, insulated-gate bipolar transistor or silicon carbide transistor.

Example 5

The power system of example 2, wherein each of the six uni-directional switches comprises two metal-oxide-semiconductor field-effect transistors (MOSFETs), the two MOSFETs being coupled at their gates and their sources.

Example 6

The power system of any of examples 2-5, further comprising an inverter controller connected to the first phase input line, the second phase input line, and the third phase input line for receiving the three phase AC input; wherein the inverter controller has a first signal line coupled to the first uni-directional switch to control the first uni-directional switch, a second signal line coupled to the second uni-directional switch to control the second uni-directional switch, a third signal line coupled to the third uni-directional switch to control the third uni-directional switch, a fourth signal line coupled to the fourth uni-directional switch to control the fourth uni-directional switch, a fifth signal line coupled to the fifth uni-directional switch to control the fifth uni-directional switch, and a sixth signal line coupled to the sixth uni-directional switch to control the sixth uni-directional switch, wherein the inverter controller comprises logic that: in response to an indication of a first phase of the three phase AC input being equal to a third phase of the three phase AC input, maintains the first uni-directional switch and the fourth uni-directional switch in an OFF state and alternates between turning on and off both the second uni-directional switch and the third uni-directional switch and turning on and off both the fifth uni-directional switch and the sixth uni-directional switch; in response to an indication of the first phase being equal to a second phase of the three phase AC input, maintains the third uni-directional switch and the sixth uni-directional switch in the OFF state and alternates between turning on and off both the first uni-directional switch and the second uni-directional switch and turning on and off both the fourth uni-directional switch and the fifth uni-directional switch; and in response to an indication of the second phase being equal to the third phase, maintains the second uni-directional switch and the fourth uni-directional switch in the OFF state and alternates between turning on and off both the first uni-directional switch and the third uni-directional switch and turning on and off both the fourth uni-directional switch and the sixth uni-directional switch.

Example 7

The power system of example 6, wherein the inverter controller is coupled to the resonant tank to receive a sensed output current and a sensed output power from the resonant tank, wherein the inverter controller further comprises logic that, while providing an adaptive ON time, modulates an amount of OFF time for each of the first, second, third, fourth, fifth, and sixth uni-directional switches based on the sensed output current and the sensed output power.

Example 8

A power system comprising: a direct three phase inverter having a first phase input line, a second phase input line, and a third phase input line for receiving a three phase AC input; and an inverter controller connected to the first phase input line, the second phase input line, and the third phase input line for receiving the three phase AC input and controlling the direct three phase inverter based on states of the three phase AC input.

Example 9

The power system of example 8, wherein the direct three phase inverter comprises six uni-directional switches, one uni-directional switch connecting the first phase input line to a first output line of the direct three phase inverter when turned on by the inverter controller, one uni-directional switch connecting the first phase input line to a second output line of the direct three phase inverter when turned on by the inverter controller, one uni-directional switch connecting the second phase input line to the first output line when turned on by the inverter controller, one uni-directional switch connecting the second phase input line to the second output line when turned on by the inverter controller, one uni-directional switch connecting the third phase input line to the first output line when turned on by the inverter controller, and one uni-directional switch connecting the third phase input line to the second output line when turned on by the inverter controller.

Example 10

The power system of example 9, wherein each of the six uni-directional switches comprises a power transistor and four diodes.

Example 11

The power system of example 9, wherein each of the six uni-directional switches comprises two metal-oxide-semiconductor field-effect transistors (MOSFETs), the two MOSFETs being coupled at their gates and their sources.

Example 12

The power system of any of examples 8-11, wherein the inverter controller comprises: a phase detector; and a gate driver comprising gate driving logics and an adaptive one-shot gate driving circuit.

Example 13

The power system of example 12, wherein the inverter controller further comprises a current/power regulator and a voltage controlled oscillator, wherein the voltage controlled oscillator outputs a signal having a frequency based on a sensed power and sensed current received via the current/power regulator, wherein the adaptive one-shot gate driving circuit receives the signal having the frequency and generates a driving signal that modulates a length of OFF time while providing an adaptive ON time.

Example 14

The power system of example 12 or 13, wherein the phase detector receives the three phase AC input and outputs corresponding voltages representative of each signal of the three phase AC input, wherein the gate driving logics comprises logic that receives the corresponding voltages representative of each signal of the three phase AC input and turns on particular switches of the direct three phase inverter based on a phase state of the signals of the three phase AC input.

Example 15

The power system of example 14, wherein the logic that receives the corresponding voltages representative of each signal of the three phase AC input and turns on particular switches of the direct three phase inverter based on a phase state of the signals of the three phase AC input comprises logic that: in response to an indication of a first phase of the three phase AC input being equal to a third phase of the three phase AC input, maintains the first uni-directional switch and the fourth uni-directional switch in an OFF state and alternates between turning on and off both the second uni-directional switch and the third uni-directional switch and turning on and off both the fifth uni-directional switch and the sixth uni-directional switch; in response to an indication of the first phase being equal to a second phase of the three phase AC input, maintains the third uni-directional switch and the sixth uni-directional switch in the OFF state and alternates between turning on and off both the first uni-directional switch and the second uni-directional switch and turning on and off both the fourth uni-directional switch and the fifth uni-directional switch; and in response to an indication of the second phase being equal to the third phase, maintains the second uni-directional switch and the fourth uni-directional switch in the OFF state and alternates between turning on and off both the first uni-directional switch and the third uni-directional switch and turning on and off both the fourth uni-directional switch and the sixth uni-directional switch.

Example 16

A power system for plasma applications, the power system comprising: a direct three phase inverter having a first phase input line, a second phase input line, and a third phase input line for receiving a three phase AC input; a resonant tank receiving an output of the direct three phase inverter to generate a sine-wave output; and an inverter controller supplying control signals to the direct three phase inverter, the inverter controller being connected to the first phase input line, the second phase input line, and the third phase input line for receiving the three phase AC input and being coupled to the resonant tank to receive a sensed output power and sensed output current.

Example 17

The power system of example 16, wherein the inverter controller reduces output power to a plasma applicator by increasing OFF time of the control signals supplied to the direct three phase inverter; and wherein the inverter controller increases output power to the plasma applicator by decreasing OFF time of the control signals.

Example 18

The power system of example 17, wherein the inverter controller comprises an adaptive one-shot gate driving circuit that provides an adaptive ON time while modulating the OFF time of the control signals based on the sensed output power and the sensed output current.

Example 19

The power system of any of examples 16-18, wherein the output of the direct three phase inverter is provided via a first output line and a second output line, wherein the direct three phase inverter comprises six uni-directional switches, one uni-directional switch connecting the first phase input line to the first output line, one uni-directional switch connecting the first phase input line to the second output line, one uni-directional switch connecting the second phase input line to the first output line, one uni-directional switch connecting the second phase input line to the second output line, one uni-directional switch connecting the third phase input line to the first output line, and one uni-directional switch connecting the third phase input line to the second output line; wherein the inverter controller has a first signal line coupled to the first uni-directional switch to control the first uni-directional switch, a second signal line coupled to the second uni-directional switch to control the second uni-directional switch, a third signal line coupled to the third uni-directional switch to control the third uni-directional switch, a fourth signal line coupled to the fourth uni-directional switch to control the fourth uni-directional switch, a fifth signal line coupled to the fifth uni-directional switch to control the fifth uni-directional switch, and a sixth signal line coupled to the sixth uni-directional switch to control the sixth uni-directional switch, wherein the inverter controller comprises logic that: in response to an indication of a first phase of the three phase AC input being equal to a third phase of the three phase AC input, maintains the first uni-directional switch and the fourth uni-directional switch in an OFF state and alternates between turning on and off both the second uni-directional switch and the third uni-directional switch and turning on and off both the fifth uni-directional switch and the sixth uni-directional switch;

in response to an indication of the first phase being equal to a second phase of the three phase AC input, maintains the third uni-directional switch and the sixth uni-directional switch in the OFF state and alternates between turning on and off both the first uni-directional switch and the second uni-directional switch and turning on and off both the fourth uni-directional switch and the fifth uni-directional switch; and in response to an indication of the second phase being equal to the third phase, maintains the second uni-directional switch and the fourth uni-directional switch in the OFF state and alternates between turning on and off both the first uni-directional switch and the third uni-directional switch and turning on and off both the fourth uni-directional switch and the sixth uni-directional switch.

Example 20

A method of supplying power to a reactive gas generator, comprising: providing a direct three phase inverter to directly receive a three phase AC input via a first phase input line, a second phase input line, and a third phase input line; and operating the direct three phase inverter according to states of the three phases of the three phase AC input.

Example 21

The method of example 20, further comprising: generating a sine wave output by providing a resonant tank coupled to an output of the direct three phase inverter.

Example 22

The method of example 20 or 21, further comprising: providing an inverter controller connected to receive the three phase AC input, the inverter controller operating the direct three phase inverter according to the states of the three phases of the three phase AC input.

Example 23

The method of example 22, further comprising: generating a one-shot driving signal at the inverter controller; and using the one-shot driving signal as a driving signal to turn on a switch of the direct three phase inverter with an adaptive ON time (e.g., a relatively constant ON time) and a modulated OFF time.

Example 24

The method of example 22 or 23, wherein operating the direct three phase inverter according to the states of the three phases of the three phase AC input comprises: in response to an indication of a first phase of the three phase AC input being equal to a third phase of the three phase AC input: generating an OFF signal to maintain a first switch and a fourth switch of the direct three phase inverter, which are coupled to the first phase input line, in an OFF state; and generating driving signals that alternately turn on and off both a second switch of the direct three phase inverter, which is coupled to the third phase input line, and a third switch of the direct three phase inverter, which is coupled to the second phase input line, and turn on and off both a fifth switch of the direct three phase inverter, which is coupled to the third phase input line, and a sixth switch of the direct three phase inverter, which is coupled to the second phase input line; in response to an indication of the first phase being equal to a second phase of the three phase AC input: generating the OFF signal to maintain the third switch and the sixth switch in the OFF state; and generating driving signals that alternately turn on and off both the first switch and the second switch and turn on and off both the fourth switch and the fifth switch; and in response to an indication of the second phase being equal to the third phase: generating the OFF signal to maintain the second switch and the fourth switch in the OFF state, and generating driving signals that alternately turn on and off both the first switch and the third switch and turn on and off both the fourth switch and the sixth switch.

Example 25

The method of example 24, further comprising: generating one-shot driving signals at the inverter controller; and using the one-shot driving signals as the driving signals to turn on and off appropriate ones of the first switch, second switch, third switch, fourth switch, fifth switch, and sixth switch of the direct three phase inverter with an adaptive ON time (e.g., a relatively constant ON time) and a modulated OFF time.

Example 26

A method of supplying power: comprising performing a method according to any of examples 20-25.

Example 27

A method of supplying power: comprising providing a power system of any of examples 1-19.

It should be understood that the examples, implementations, and embodiments described herein are for illustrative purposes only and that various modifications or changes in light thereof will be suggested to persons skilled in the art and are to be included within the spirit and purview of this application.

What is claimed is:

1. A power system comprising:
a direct three phase inverter having a first phase input line, a second phase input line, and a third phase input line for receiving a three phase AC input;
a resonant tank receiving an output of the direct three phase inverter; and
an inverter controller connected to the first phase input line, the second phase input line, and the third phase input line for receiving the three phase AC input;
wherein the output of the direct three phase inverter is provided to the resonant tank via a first output line and a second output line, wherein the direct three phase inverter comprises six uni-directional switches, one uni-directional switch connecting the first phase input line to the first output line, one uni-directional switch connecting the first phase input line to the second output line, one uni-directional switch connecting the second phase input line to the first output line, one uni-directional switch connecting the second phase input line to the second output line, one uni-directional switch connecting the third phase input line to the first output line, and one uni-directional switch connecting the third phase input line to the second output line;
wherein the inverter controller has a first signal line coupled to the first uni-directional switch to control the first uni-directional switch, a second signal line coupled to the second uni-directional switch to control the second uni-directional switch, a third signal line coupled to the third uni-directional switch to control the third uni-directional switch, a fourth signal line coupled to the fourth uni-directional switch to control the fourth uni-directional switch, a fifth signal line coupled to the fifth uni-directional switch to control the fifth uni-directional switch, and a sixth signal line coupled to the sixth uni-directional switch to control the sixth uni-directional switch, wherein the inverter controller comprises logic that:

in response to an indication of a first phase of the three phase AC input being equal to a third phase of the three phase AC input, maintains the first uni-directional switch and the fourth uni-directional switch in an OFF state and alternates between turning on and off both the second uni-directional switch and the third uni-directional switch and turning on and off both the fifth uni-directional switch and the sixth uni-directional switch;

in response to an indication of the first phase being equal to a second phase of the three phase AC input, maintains the third uni-directional switch and the sixth uni-directional switch in the OFF state and alternates between turning on and off both the first uni-directional switch and the second uni-directional switch and turning on and off both the fourth uni-directional switch and the fifth uni-directional switch; and in response to an indication of the second phase being equal to the third phase, maintains the second uni-directional switch and the fourth uni-directional switch in the OFF state and alternates between turning on and off both the first uni-directional switch and the third uni-directional switch and turning on and off both the fourth uni-directional switch and the sixth uni-directional switch.

2. The power system of claim 1, wherein each of the six uni-directional switches comprises a power transistor and four diodes.

3. The power system of claim 2, wherein the power transistor is a metal-oxide-semiconductor field-effect transistor, bipolar junction transistor, insulated-gate bipolar transistor or silicon carbide transistor.

4. The power system of claim 1, wherein each of the six uni-directional switches comprises two metal-oxide-semiconductor field-effect transistors (MOSFETs), the two MOSFETs being coupled at their gates and their sources.

5. The power system of claim 1, wherein the inverter controller is coupled to the resonant tank to receive a sensed output current and a sensed output power from the resonant tank, wherein the inverter controller further comprises logic that, while providing an adaptive ON time, modulates an amount of OFF time for each of the first, second, third, fourth, fifth, and sixth uni-directional switches based on the sensed output current and the sensed output power.

6. A power system comprising:

a direct three phase inverter having a first phase input line, a second phase input line, and a third phase input line for receiving a three phase AC input; and an inverter controller connected to the first phase input line, the second phase input line, and the third phase input line for receiving the three phase AC input and controlling the direct three phase inverter based on states of the three phase AC input, wherein the inverter controller comprises:

a phase detector;

a gate driver comprising gate driving logics and an adaptive one-shot gate driving circuit; and a current/power regulator and a voltage controlled oscillator, wherein the voltage controlled oscillator outputs a signal having a frequency based on a sensed power and sensed current received via the current/power regulator, wherein the adaptive one-shot gate driving circuit receives the signal having the frequency and generates a driving signal that modulates a length of OFF time while providing an adaptive ON time.

7. The power system of claim 6, wherein the phase detector receives the three phase AC input and outputs corresponding voltages representative of each signal of the three phase AC input, wherein the gate driving logics comprises logic that receives the corresponding voltages representative of each signal of the three phase AC input and turns on particular switches of the direct three phase inverter based on a phase state of the signals of the three phase AC input.

8. The power system of claim 7, wherein the direct three phase inverter comprises six uni-directional switches, one uni-directional switch connecting the first phase input line to a first output line of the direct three phase inverter when turned on by the inverter controller, one uni-directional switch connecting the first phase input line to a second output line of the direct three phase inverter when turned on by the inverter controller, one uni-directional switch connecting the second phase input line to the first output line when turned on by the inverter controller, one uni-directional switch connecting the second phase input line to the second output line when turned on by the inverter controller, one uni-directional switch connecting the third phase input line to the first output line when turned on by the inverter controller, and one uni-directional switch connecting the third phase input line to the second output line when turned on by the inverter controller.

9. The power system of claim 8, wherein the logic that receives the corresponding voltages representative of each signal of the three phase AC input and turns on particular switches of the direct three phase inverter based on a phase state of the signals of the three phase AC input comprises logic that:

in response to an indication of a first phase of the three phase AC input being equal to a third phase of the three phase AC input, maintains the first uni-directional switch and the fourth uni-directional switch in an OFF state and alternates between turning on and off both the second uni-directional switch and the third uni-directional switch and turning on and off both the fifth uni-directional switch and the sixth uni-directional switch;

in response to an indication of the first phase being equal to a second phase of the three phase AC input, maintains the third uni-directional switch and the sixth uni-directional switch in the OFF state and alternates between turning on and off both the first uni-directional switch and the second uni-directional switch and turning on and off both the fourth uni-directional switch and the fifth uni-directional switch; and in response to an indication of the second phase being equal to the third phase, maintains the second uni-directional switch and the fourth uni-directional switch in the OFF state and alternates between turning on and off both the first uni-directional switch and the third uni-directional switch and turning on and off both the fourth uni-directional switch and the sixth uni-directional switch.

10. The power system of claim 8, wherein each of the six uni-directional switches comprises a power transistor and four diodes.

11. The power system of claim 8, wherein each of the six uni-directional switches comprises two metal-oxide-semiconductor field-effect transistors (MOSFETs), the two MOSFETs being coupled at their gates and their sources.

12. A power system for plasma applications, the power system comprising:
- a direct three phase inverter having a first phase input line, a second phase input line, and a third phase input line for receiving a three phase AC input;
- a resonant tank receiving an output of the direct three phase inverter to generate a sine-wave output; and
- an inverter controller supplying control signals to the direct three phase inverter, the inverter controller being connected to the first phase input line, the second phase input line, and the third phase input line for receiving the three phase AC input and being coupled to the resonant tank to receive a sensed output power and a sensed output current,
- wherein the inverter controller reduces output power to a plasma applicator by increasing OFF time of the control signals supplied to the direct three phase inverter; and wherein the inverter controller increases output power to the plasma applicator by decreasing OFF time of the control signals.

13. The power system of claim 12, wherein the inverter controller comprises an adaptive one-shot gate driving circuit that provides an adaptive ON time while modulating the OFF time of the control signals based on the sensed output power and the sensed output current.

14. The power system of claim 12, wherein the output of the direct three phase inverter is provided via a first output line and a second output line,
- wherein the direct three phase inverter comprises six uni-directional switches, one uni-directional switch connecting the first phase input line to the first output line, one uni-directional switch connecting the first phase input line to the second output line, one uni-directional switch connecting the second phase input line to the first output line, one uni-directional switch connecting the second phase input line to the second output line, one uni-directional switch connecting the third phase input line to the first output line, and one uni-directional switch connecting the third phase input line to the second output line;
- wherein the inverter controller has a first signal line coupled to the first uni-directional switch to control the first uni-directional switch, a second signal line coupled to the second uni-directional switch to control the second uni-directional switch, a third signal line coupled to the third uni-directional switch to control the third uni-directional switch, a fourth signal line coupled to the fourth uni-directional switch to control the fourth uni-directional switch, a fifth signal line coupled to the fifth uni-directional switch to control the fifth uni-directional switch, and a sixth signal line coupled to the sixth uni-directional switch to control the sixth uni-directional switch,
- wherein the inverter controller comprises logic that:
  - in response to an indication of a first phase of the three phase AC input being equal to a third phase of the three phase AC input, maintains the first uni-directional switch and the fourth uni-directional switch in an OFF state and alternates between turning on and off both the second uni-directional switch and the third uni-directional switch and turning on and off both the fifth uni-directional switch and the sixth uni-directional switch;
  - in response to an indication of the first phase being equal to a second phase of the three phase AC input, maintains the third uni-directional switch and the sixth uni-directional switch in the OFF state and alternates between turning on and off both the first uni-directional switch and the second uni-directional switch and turning on and off both the fourth uni-directional switch and the fifth uni-directional switch; and
  - in response to an indication of the second phase being equal to the third phase, maintains the second uni-directional switch and the fourth uni-directional switch in the OFF state and alternates between turning on and off both the first uni-directional switch and the third uni-directional switch and turning on and off both the fourth uni-directional switch and the sixth uni-directional switch.

15. A method of supplying power to a reactive gas generator, comprising:
- providing a direct three phase inverter to directly receive a three phase AC input via a first phase input line, a second phase input line, and a third phase input line;
- providing an inverter controller connected to receive the three phase AC input; and
- operating the direct three phase inverter according to states of the three phases of the three phase AC input, the inverter controller operating the direct three phase inverter according to the states of the three phases of the three phase AC input, wherein operating the direct three phase inverter according to the states of the three phases of the three phase AC input comprises:
  - in response to an indication of a first phase of the three phase AC input being equal to a third phase of the three phase AC input:
    - generating an OFF signal to maintain a first switch and a fourth switch of the direct three phase inverter, which are coupled to the first phase input line, in an OFF state; and
    - generating driving signals that alternately turn on and off both a second switch of the direct three phase inverter, which is coupled to the third phase input line, and a third switch of the direct three phase inverter, which is coupled to the second phase input line, and turn on and off both a fifth switch of the direct three phase inverter, which is coupled to the third phase input line, and a sixth switch of the direct three phase inverter, which is coupled to the second phase input line;
  - in response to an indication of the first phase being equal to a second phase of the three phase AC input:
    - generating the OFF signal to maintain the third switch and the sixth switch in the OFF state; and
    - generating driving signals that alternately turn on and off both the first switch and the second switch and turn on and off both the fourth switch and the fifth switch; and
  - in response to an indication of the second phase being equal to the third phase:
    - generating the OFF signal to maintain the second switch and the fourth switch in the OFF state, and
    - generating driving signals that alternately turn on and off both the first switch and the third switch and turn on and off both the fourth switch and the sixth switch.

16. The method of claim 15, further comprising:
generating a sine wave output by providing a resonant tank coupled to an output of the direct three phase inverter.

17. The method of claim 15, further comprising:
generating a one-shot driving signal at the inverter controller; and
using the one-shot driving signal as a driving signal to turn on a switch of the direct three phase inverter with an adaptive ON time and a modulated OFF time.

18. The method of claim 15, further comprising:
generating one-shot driving signals at the inverter controller; and
using the one-shot driving signals as the driving signals to turn on and off appropriate ones of the first switch, second switch, third switch, fourth switch, fifth switch, and sixth switch of the direct three phase inverter with an adaptive ON time and a modulated OFF time.

\* \* \* \* \*